United States Patent [19]
Tomari et al.

[11] Patent Number: 6,156,413
[45] Date of Patent: *Dec. 5, 2000

[54] GLASS CIRCUIT SUBSTRATE AND FABRICATION METHOD THEREOF

[75] Inventors: Yoshiaki Tomari, Yokohama; Makoto Kameyama, Funabashi; Yasuyuki Nakai, Tokyo, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/956,700

[22] Filed: Oct. 24, 1997

[30] Foreign Application Priority Data

Oct. 25, 1996 [JP] Japan ................................. 8-284073
Jan. 17, 1997 [JP] Japan ................................. 9-006384
Jun. 24, 1997 [JP] Japan ................................. 9-167152

[51] Int. Cl.$^7$ ................................................ B32B 3/00
[52] U.S. Cl. ..................... 428/209; 428/209; 428/434; 428/469; 428/620; 428/630; 428/670; 428/671; 428/672; 428/673; 106/1.11; 106/1.24; 106/1.28
[58] Field of Search ................................. 428/209, 434, 428/469, 620, 630, 670–673, 936; 106/1.11, 1.24, 1.28

[56] References Cited

U.S. PATENT DOCUMENTS

| | | | |
|---|---|---|---|
| 3,754,939 | 8/1973 | Pearlstein et al. | 106/1 |
| 4,255,194 | 3/1981 | Hough et al. | 106/1.24 |
| 4,424,241 | 1/1984 | Abys | 427/443.1 |
| 5,569,545 | 10/1996 | Yokono et al. | 428/462 |
| 5,810,913 | 9/1998 | Kanoh et al. | 106/1.05 |
| 5,882,736 | 3/1999 | Stein et al. | 427/437 |

FOREIGN PATENT DOCUMENTS

| | | |
|---|---|---|
| 3125730 | 1/1983 | Germany. |
| 4113686 | 10/1992 | Germany. |
| 64-67840 | 3/1989 | Japan. |
| 2-69720 | 3/1990 | Japan. |
| 4-17211 | 1/1992 | Japan. |
| 6-61619 | 3/1994 | Japan. |
| 8-271869 | 10/1996 | Japan. |
| 1380890 | 1/1975 | United Kingdom. |

OTHER PUBLICATIONS

Hotta et al., "Adhesion of Electroless Nickel Plating on Glass", Hyomen Gijutsu (Surface Technology), vol. 44, No. 10, 1993, pp. 67–71.

Mizumoto, et al., "Electroless Plating of Pd–P Alloys from Ethylenediamine Complex Solutions", Hyomen Gijutsu, vol. 40, No. 3, 1989, pp. 123–126.

Honma, et al., "Electroless Pd–P Alloy Plating and Properties of the Deposited Film", Journal of Japan Institute of Printed Circuit "Circuit Technology", 7(4), pp. 263–271 (1992).

Otsuka, et al., "The Low Stress Electroless Palladium Plating and the Property of the Deposits", Journal of Japan Institute of Printed Circuit "Circuit Technology", 7(6), pp. 369–376 (1992).

Mizumoto, et al., "Mass Balance and Deposition Mechanism in Electroless Pd–P Alloy Plating from a Ethylenediamine Complex Bath Using Hypophosphite as a Reducing Agent", Hyomen Gijutsu, vol. 44, No. 5, 1993, pp. 33–37.

Chinda, et al., "Characteristics of Palladium Plated Lead Frames after Thermal Treatment", Hyomen Gijutsu, vol. 44, No. 12, 1993, pp. 136–139.

Haga, et al., "Electroless Pd–P Alloy Plating Using Phosphite as a Reducing Agent and Mechanism of its Autocatalytic Reduction", Hyomen Gijutsu, vol. 42, No. 11, 1992, pp. 90–95.

Patent Abstracts of Japan, 97, 2 (Feb. 1997) for JP 08–271869.

Patent Abstracts of Japan, 18, (E–1558) Jun. 1994 for JP 06–61619.

*Primary Examiner*—Timothy Speer
*Assistant Examiner*—Bryant Young
*Attorney, Agent, or Firm*—Fitzpatrick, Cella, Harper & Scinto

[57] ABSTRACT

A glass circuit substrate wherein nuclei of Pd (palladium) are placed on a glass substrate and a plating layer of Pd—P (palladium—phosphorus) is placed on the nuclei. A fabrication method of the glass circuit substrate comprises steps of forming nuclei of Pd on a glass substrate; and therefore forming a plating layer of Pd—P on the nuclei.

45 Claims, 16 Drawing Sheets

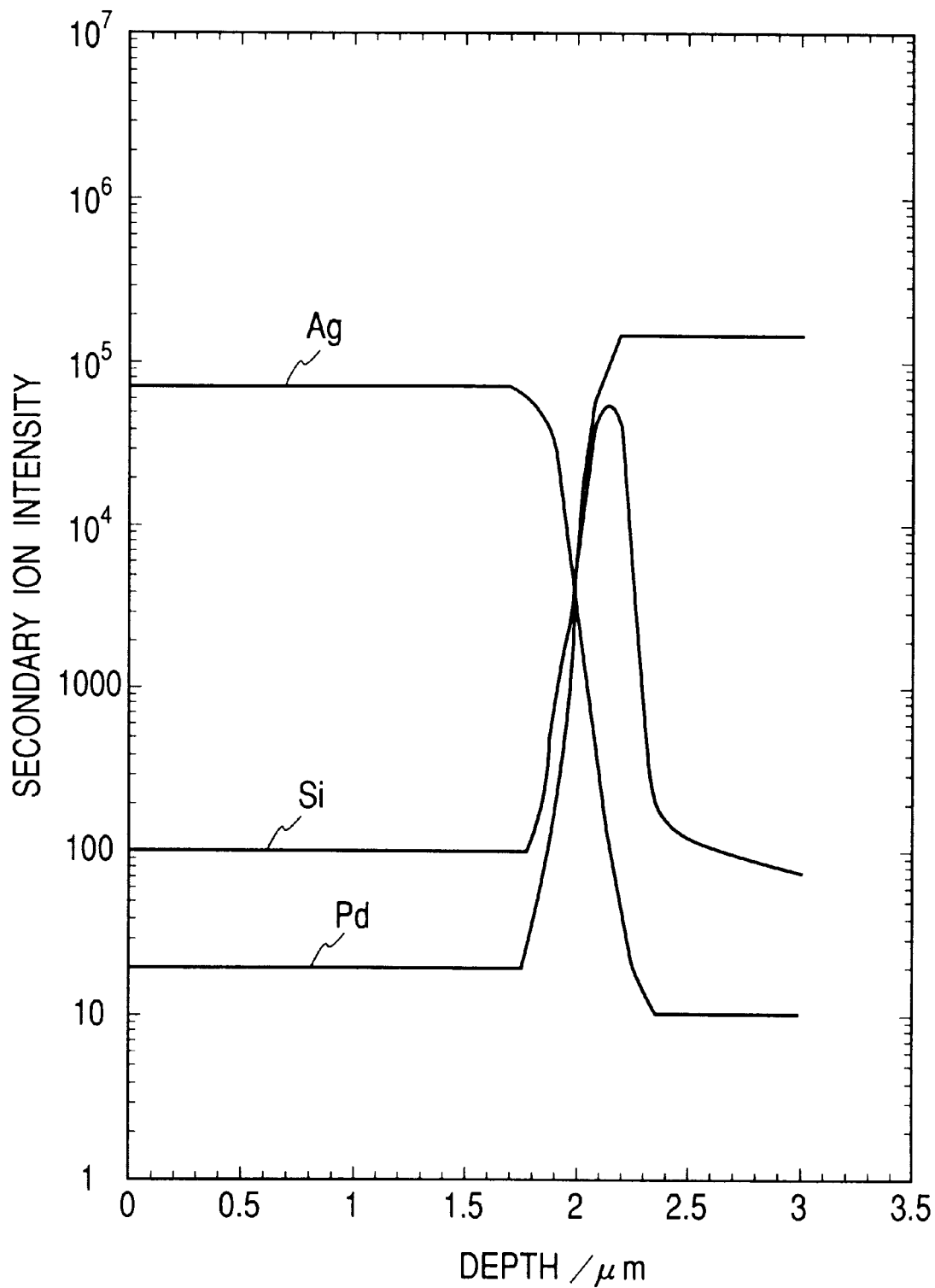

GLASS CIRCUIT SUBSTRATE AND FABRICATION METHOD THEREOF

BACKGROUND OF THE INVENTION

1. Field of the Invention

The present invention relates to a glass circuit substrate that is obtained by forming a metal layer on a glass substrate and forming wiring and electrodes therein and a fabrication method thereof. More particularly, the present invention relates to a glass circuit substrate having the wiring and electrodes formed with high adhesion by wet plating while retaining smoothness of the surface of glass substrate, and a fabrication method thereof.

2. Related Background Art

The following is one of the conventionally known methods for metallizing glass, which is an insulating substrate, by wet plating. Specifically, the surface of glass is first degreased to be cleaned, then the surface is roughened by etching. Theraftrer, it is dipped in Sn—Pd colloid solution to make the roughened surface capture colloidal particles, and then a tin overcoat of tin-palladium colloid is removed by an acid, thereby obtaining Pd metal nuclei for plating.

The substrate thus processed is dipped in an electroless nickel—phosphorus (hereinafter referred to as Ni—P) plating solution, whereby an electroconductive metal layer of Ni—P plating film is formed on the surface of substrate with the above Pd metal nuclei acting as catalyst nuclei.

A prior art example is a research report presented by Honma et al. (Hyomen Gijutsu (Surface Technology) vol. 44, No. 10, 1993) to describe the method for roughening glass with 10% hydrofluoric acid, then providing it with the Pd nuclei, and thereafter forming the electroless Ni—P plating.

For forming a metal wiring pattern on the insulating substrate by plating, normally, the above Ni—P plating film is deposited in about 1 $\mu$m on the surface of the insulating substrate and thereafter a low-resistance metal layer of Cu plating or the like is deposited thereon in the thickness of several pm to several ten $\mu$m.

In this case, the Ni—P plating film plays a role like an undercoat layer for depositing the low-resistance metal plating film on the surface of insulating substrate.

In addition to the metallizing method described above, there is another method for coating the surface of a substrate with an amino silane coupling agent having one end at a functional group with affinity to the surface of insulating substrate and at the other end an amino group, or a like agent, in contact with palladium chloride solution so as to make the amino groups capture Pd ions, and then reducing the Pd ions to metal Pd with a reducing agent such as sodium hypophosphite. A metal layer can be formed on the catalyst nuclei formed in this way, by use of the electroless nickel plating or the like.

Another prior art example is a method for forming an electroconductive layer on an insulating member, in which a semiconductor layer of either ZnO or $WO_3$ is formed on the insulating member, a film of Pd, Pt, Au, Ag, or the like is then deposited thereon, and thereafter the electroconductive layer of Cu or the like is placed thereon, which was disclosed in applications filed by Fujishima et al. (Japanese Laid-open Patent Application No. 6-61619 and Japanese Laid-open Patent Application No. 4-17211).

For forming a desired metal pattern on these insulating substrates, a known method is the subtractive method for first forming a necessary metal layer over the entire surface of the substrate by plating, then protecting the metal layer in necessary portions by a photoresist process or the like, and removing non-protected portions with an etchant.

The plating film formed on the conventional glass substrates, however, had the following problems.

For achieving plating of the metal layer on the glass surface with high adhesion, the conventional technology needed to roughen the surface with hydrofluoric acid. Then the roughened substrate is dipped in a sensitizing solution containing approximately 0.1 g/l of stannous chloride ($SnCl_2$) to undergo a sensitizing process, thereby making the roughened surface capture $Sn^{2+}$ ions.

This substrate is dipped in an activation solution (containing about 0.1 g/l of palladium chloride) to substitute the $Sn^{2+}$ ions captured for $Pd^{2+}$, ions, thereby forming Pd catalyst nuclei for electroless plating. In addition to this pretreatment method, another known method is the alkali catalyst method for making an organic complex compound of Pd adsorb to the surface of glass substrate at pH 9 to 13.

Then an electroless Ni—P plating layer is deposited in about 0.5 ($\mu$m) on the catalyst nuclei, a Cu plating film is further deposited up to a necessary thickness (normally about 3 to 20 $\mu$m), and Ni and Au plating films are formed as Cu-oxidation inhibitor layers thereon. In the circuit substrate having the above configuration, the adhesive force between the electroless Ni—P plating layer and the glass substrate results from the anchor effect due to intrusion of the plating layer into the roughened surface of glass having complex shapes.

However, if the adhesive force necessary for use for circuit patterns relies only upon the anchor effect, the surface must be roughened before the average surface roughness Ra of glass becomes approximately 0.2 $\mu$m. This will degrade such characteristics as transparency and smoothness that the glass substrate originally has. In addition, microcracks more easily occur in the entire surface, and they often cause reductions in the strength of substrate. Further, it becomes hard to ensure the accuracy of fine line pattern necessary for electron devices or the like and there is a problem that a probability of breaking of wire becomes high in patterning of fine lines.

Another problem is that the Ni—P plating film starts being affected by crystallization due to creation of nickel phosphide after the heating temperature becomes over 100° C. and that it is converted to $Ni_3P$ near 400° C. to cause strain between the Pd catalyst nuclei and the Ni plating layer, thereby degrading adhesion.

There is also a method for providing a coupling agent between the glass substrate and the plating layer in order to avoid the degradation of smoothness of substrate surface, but this method has a problem that annealing is allowed only at temperatures below the decomposition temperature of the coupling agent and that temperatures of the atmosphere used are also limited to those below the decomposition temperature of the coupling agent.

A further method is a one for forming a circuit pattern by printing of a metal paste on glass, but it has the following drawbacks; the metal paste patterned needs to be baked at high temperatures, and the substrate is thus readily deformed upon the baking; only crystalline glass with high heat resistance can be used, which is a cause of increase of cost; it is not easy to achieve flatness of pattern surface by printing.

Here, utilizing the method as disclosed in Japanese Laid-open Patent Application No. 6-61619 and Japanese Laid-open Patent Application No. 4-17211, the plating film can be deposited on the glass substrate with high adhesion, but it necessitates the ZnO or $WO_3$ film forming process, thus posing a problem of increase in film-forming cost. In addition, if a low-melting-point glass substrate such as blue sheet glass is used, the problem of warp, strain, or the like of the glass substrate will arise, because high temperatures are needed in the film-forming process of ZnO or $WO_3$.

When the substrate for wiring is made by forming the metal layer on the glass substrate, the following problems are considered.

(1) In the case of printing, after the metal paste printed on the glass substrate is baked, the components other than the metal component in the paste will remain in the wiring, resulting in increasing the resistance. Since the paste is baked at several hundred degrees, the metal component making the wiring will be oxidized in the case of baking in the atmosphere. This is also a cause to increase the wiring resistance. Therefore, the resistance is higher than that of the deposited film mostly made of the metal component.

(2) When the wiring is made by plating on an ITO film, peeling will occur between the glass substrate and the ITO film upon depositing the plating film on the ITO film unless the adhesive force is sufficient between the ITO film and the glass substrate. Especially, in the case of electroless plating, stress is high in the plating film, so that peeling may occur between the glass substrate and the ITO film when the plating film is deposited in 2 to 3 $\mu$m.

(3) In the case of direct electroless plating on the glass substrate, when another plating film is further deposited on the electroless plating film, the plating layer may also be peeled off from the glass substrate because of stress of the deposited film, similar to above. As well known, the plating film on the metal undercoat layer does not exhibit so high adhesion to the glass substrate by nature. This means that, in order to form a metal layer with high adhesion on a non-roughened glass substrate such as blue sheet glass, it is important that for formation of the metal layer (the plating film), the substrate and the metal undercoat layer first be connected with each other by strong coupling resistant to the stress of deposit plating film.

On the other hand, there is a technique so called chip on glass (COG) for directly mounting electronic parts such as IC on the glass substrate. Glass circuit substrates applicable to this technique are required to have some high characteristics.

Mass-production methods of COG include the flip chip bonding method (which is a method for bonding a chip to a conductive part of substrate with an electroconductive adhesive) and the wire bonding method.

In this case, wires preliminarily provided with bumps are formed on the glass substrate to which the chip is to be bonded. For this, conventionally known methods for forming the conductive layer with good adhesion on glass or ceramics include a method for forming a film of ITO on the glass substrate by sputtering and building the wiring part up thereon by electroless Ni plating and a method for forming a pattern of a paste containing a metal by screen printing and baking it to form wiring (see Japanese Laid-open Patent Application No. 64-67840). Another example to realize COG is a technique for mounting semiconductor devices for drive on a film of Ni and gold plating on a transparent electrode (see Japanese Laid-open Patent Application No. 2-69720 and Japanese Laid-open Patent Application No. 8-271869).

However, the glass substrates are often used for displays and the like in these years and, particularly, decrease in the wiring resistance is thus indispensable for large-screen arrangement. This is because the large-screen arrangement naturally increases the wiring length so as to raise the need for decreasing the wiring resistance. If the wiring resistance were high, the power applied would be converted to heat and this would further raise the resistance, resulting in failing to supply desired power. There thus remains a problem that the wiring needs to be thick and deep for decreasing the resistance.

An example thereof is as follows. Plasma displays today are often made by forming multilayer coatings of print paste and baking it, and in this case, the wiring after baked is porous and organic materials among the paste components are a cause to obstruct the decrease of resistance. Film formation of ITO by sputtering is normally employed for formation of the conductive layer on the non-roughened glass substrate nowadays. The ITO film, however, has problems that the volume resistivity is of the order of 10E-4 $\Omega$cm, which is two figures higher than those of the plating films and that the throughput (mass productivity) is relatively low because of use of deposition apparatus.

Thus proposed was a method for forming various micro wires and micro electrodes on the glass substrate by means of plating. In this case, when the glass substrate 41 is roughed as in the conventional method in order to secure adhesion between the glass substrate 41 and the plating film 42 as shown in FIG. 30, the anchor effect can be expected at the interface 43 between them, but the shape of the roughed surface also appears on the plating film 42 as it is. For example, when a thin electrode 44 of a noble metal is made as shown in FIG. 31, there is a problem that a part of the electroless plating film of undercoat is exposed in the electrode surface as indicated by numeral 45 in the drawing, which could degrade reliability of connection with an electronic part and damage characteristics of electrode.

Under such circumstances, it becomes necessary to use a glass substrate in a non-roughed state, for example a glass substrate in a mirror surface state such as float glass or polished glass. Recent trends in development of display seem to be directed toward lightweight, thin, and compact displays, so that compact packaging is also required at present.

SUMMARY OF THE INVENTION

The present invention has been accomplished in view of the above problems and presents a wiring forming method by wet plating without forming any special undercoat layer on the glass substrate, without degrading the smoothness of glass surface, and with little degrading adhesion against thermal influence from the outside.

Another object of the present invention is to provide a glass wiring substrate in which the adhesive force is enhanced between the glass substrate and the metal layer whereby the metal film is resistant to peeling.

Still another object of the present invention is to provide a glass circuit substrate onto which electronic elements such as IC can be connected under high reliability.

Still another object of the present invention is to provide a fabrication method of glass circuit substrate comprising steps of forming nuclei of Pd (palladium) on a glass substrate and thereafter forming a plating layer of Pd—P (palladium—phosphorus) on the nuclei.

Still another object of the present invention is to provide a glass circuit substrate in which nuclei of Pd (palladium) are placed on a glass substrate and a plating layer of Pd—P (palladium—phosphorus) is placed on the nuclei.

According to the present invention, the a-Pd plating layer containing a fixed amount of P is formed in an appropriate thickness as a first layer on the catalyst nuclei mainly of palladium provided on the glass substrate, whereby the plating layer with sufficient adhesion can be formed without extreme roughing of the glass substrate.

By depositing an almost crystalline c-Pd plating layer on this a-Pd layer, the Pd plating laminate film with contents of P varying on a gradient basis can be formed and, in the case of forming thin lines of a thick film on a smooth glass substrate, the metallized glass substrate with wiring and electrodes can be fabricated with both stability of film and adhesion by wet plating.

As described above, the present invention provides the glass circuit substrate in which the adhesive force is enhanced between the glass substrate and the metal layer whereby the metal film is resistant to peeling.

Further, the present invention provides the glass circuit substrate in which the adhesive force is enhanced between the glass substrate and the metal layer without roughing the surface of glass substrate whereby the metal film is resistant to peeling.

BRIEF DESCRIPTION OF THE DRAWINGS

FIG. 19 is a drawing to show results of depthwise analysis by SIMS before the heat treatment;

DETAILED DESCRIPTION OF THE PREFERRED EMBODIMENTS

Figure 1:
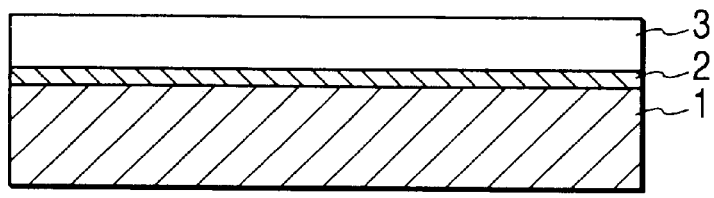
FIG. 1 is a schematic, cross-sectional view of a metallized glass substrate having the layer structure shown in Example 1, Example 2, and Example 3 of the present invention.

The present invention relates to a glass circuit substrate wherein nuclei of Pd (palladium) are placed on a glass substrate and a plating layer of Pd—P (Palladium—phosphorus) is placed on the nuclei.

The present invention also relates to a fabrication method of glass circuit substrate comprising steps of forming nuclei of Pd on a glass substrate; and therefore forming a plating layer of Pd—P on the nuclei.

The present invention is characterized in that an a-(amorphous) Pd plating layer containing a fixed amount of P is formed in an appropriate thickness as a first layer on the catalyst nuclei mainly of palladium provided on the glass substrate, whereby the plating layer with sufficient adhesion can be formed without extreme roughing of the glass substrate.

In addition, according to the present invention, a c-(crystal) Pd plating layer nearly crystalline is deposited on this a-Pd layer, thereby making a gradient change in the contents of P in the Pd laminate film, and in patterning of fine lines on a smooth glass substrate, the metallized glass substrate having the wiring and electrodes can be obtained by wet plating with excellent stability of film, adhesion, and resolution.

According to the present invention, the catalyst nuclei mainly of metal Pd are formed on the entire surface or a part of the glass substrate the average surface roughness Ra of which is from 0.0010 ($\mu$m) to 0.10 ($\mu$m), preferably from 0.0012 ($\mu$m) to 0.050 ($\mu$m), and further formed on the catalyst nuclei is the a-Pd plating layer the thickness of which is from 0.015 ($\mu$m) to 0.50 ($\mu$m), preferably from 0.020 ($\mu$m) to 0.40 ($\mu$m), and the content of phosphorus of which is from 3.0 (wt %) to 10.0 (wt %), preferably from 3.5 (wt %) to 9.0 (wt %), thereby obtaining the glass circuit substrate having the plating wiring without degrading the smoothness of the surface of glass and with little degradation of adhesion against thermal influence from the outside.

At this time, the pretreatment step carried out prior to the catalyst nuclei forming step needs to be conducted with chemicals and under conditions not making microcracks in the surface of glass substrate. The catalyst nuclei forming process on the glass substrate can be carried out suitably utilizing either one of the sensitizer activator method for substituting Pd for Sn adsorbing to the surface of substrate, the catalyst accelerator method for making Sn—Pd colloid adsorb to the surface of substrate, and the alkali catalyst method for making an alkaline Pd complex adsorb to the surface of substrate and thereafter reducing it to metal Pd of zerovalence.

The thickness and the content of phosphorus of the a-Pd plating layer deposited on the catalyst nuclei greatly affect adhesion of the formed circuit pattern to the glass substrate.

Namely, the average surface roughness Ra of the glass substrate is in the range of 0.0010 ($\mu$m) to 0.10, preferably in the range of 0.0012 ($\mu$m) to 0.050 ($\mu$m); if it is smaller than 0.0010 ($\mu$m) adhesion will tend to be degraded; if it is greater than 0.10 ($\mu$m) defects will tend to be made upon patterning of thin film.

Similarly, the thickness of the a-Pd plating layer is in the range of 0.015 ($\mu$m) to 0.50 ($\mu$m), preferably in the range of 0.020 ($\mu$m) to 0.40 ($\mu$m); if it is smaller than 0.015 ($\mu$m) the film will tend to be formed with many defects; if it is greater than 0.50 ($\mu$m) peeling of film will tend to take place readily.

Further, the content of phosphorus in the a-Pd plating layer is in the range of 3.0 (wt %) to 10 (wt %), preferably in the range of 3.5 (wt %) to 9.0 (wt %); if it is smaller than 3.0 (wt %) stress of film will increase to make peeling easier to take place; if it is greater than 10 (wt %) the temperature of plating will need to be set high upon electroless Pd plating, so that plating will need to be conducted under conditions to easily decompose the plating solution, which is not suitable for mass production.

In addition, the present invention is characterized in that after patterning is done, if necessary, by photolithography, etching, and the like on the a-Pd plating layer, a plating layer may be deposited thereon of at least one metal or an alloy of two or more selected from Cu, Ni, Ni—P, Ag, Pd, Pd—P, Au, and Pt, whereby the glass circuit substrate having the plating wiring can be obtained without degrading the smoothness of the glass surface and with little degradation of adhesion against the thermal influence from the outside.

Further, the present invention is characterized in that after formation of the a-Pd plating layer on the glass substrate, patterning is done by photolithography, etching, and the like on the a-Pd plating layer, if necessary, and the entire surface or a part thereof is covered by the c-Pd plating layer the content of P of which is between 0 and 1 wt %, preferably between 0 and 0.5 wt %, and the thickness of which is between 0.015 ($\mu$m) and 0.25 ($\mu$m), preferably between 0.020 ($\mu$m) and 0.20 ($\mu$m), whereby the glass circuit substrate having the plating wiring can be obtained without degrading the smoothness of glass surface and with revealing excellent adhesive force to the glass substrate and, in addition, the glass circuit substrate shows less change of resistance when subjected to a heat history, as compared with plating in the single film form of the a-Pd plating film of the present invention, and further has the plating wiring with a stable surface.

The reason why the resistance change upon heating becomes less than in the case of the single film formation of the a-Pd plating film of the present invention is that the a-Pd plating film has the nearly amorphous film structure while the c-Pd plating film has the nearly polycrystalline film structure.

In fact, line patterns of the pattern width 200 $\mu$m and the length 8 cm were made on a metallized glass substrate deposited in the laminate structure of {glass/a-Pd (0.04 $\mu$m)/c-Pd (0.04 $\mu$m)}, it was baked at 450° C. in an oxidizing atmosphere for 40 minutes, and changes in the volume resistivity were measured before and after the heating by the four probe method.

At this time, an average of measured volume resistivities of the laminate film before and after baking was $6.5 \times 10^{-5}$ ($\Omega$cm) before baking and $4 \times 10^{-5}$ ($\Omega$cm) after baking (with 100 samples).

Further, when this double layer structure is applied, it is possible to diffuse P from the a-Pd layer into the c-Pd layer by an appropriate heat treatment, thereby achieving the continuously gradient decrease of content of P from the a-Pd plating layer to the c-Pd plating layer. When the film has a gradient of content of P across the two layers, it can relax stress appearing upon lamination of the films of different crystalline structures, so that the adhesion to the substrate can be increased with decreasing the stress of film.

By employing the thin film of the double layer structure having the c-Pd plating film in the surface, it becomes possible to deposit a noble metal with higher oxidation-reduction potential than Pd without intervention of another metal except for Pd; e.g., Pt or Au which was hard to be directly deposited on the a-Pd plating thin film because of film damage due to substitution.

Here, if the thickness of the above c-Pd plating film is smaller than 0.015 ($\mu$m) no effect will be seen on the improvement in the electrical property upon heating because of influence of diffusion of P into the film. If the thickness is greater than 0.25 ($\mu$m) the film stress will increase so as to make peeling of film easier to take place. Similarly, if the content of phosphorus of the layer is greater than 1.0 (wt %)

no distinct improvement will be seen in the electric characteristics and the stability of film, when compared with the single film of a-Pd plating layer.

The present invention is also characterized in that a plating layer of at least one metal or an alloy of two or more selected from Cu, Ni, Ni—P, Ag, Au, and Pt is deposited on the entire surface or a part of the a-Pd/c-Pd laminate film, whereby the lamination can be made without degrading the smoothness which the surface of glass substrate has by nature and with minimizing the damage of catalyst nuclei and the damage of film in the subsequent surface treatment and it is also advantageous in terms of resistance upon execution of electroplating.

The present invention will be described in further detail by reference to the drawings. The method for providing the Pd catalyst nuclei on glass and forming a chemical Ni—P plating film thereon is conventionally known and the method for depositing Cu or the like on this Ni—P plating film to make wiring is also well known.

Figure 10:
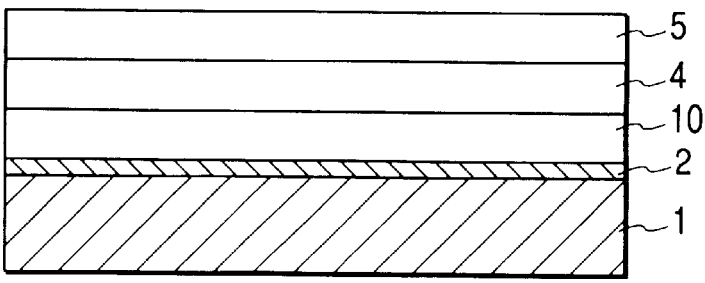
FIG. 10 is a schematic, cross-sectional view of a metallized glass substrate having the layer structure shown in Comparative Example 3 of the present invention.

FIG. 10 is a schematic drawing to show the layer structure of wet plating known as a conventional example, in which numeral 1 denotes a roughed glass substrate, 2 a catalyst nuclei layer mainly of the metal Pd, and 10 an amorphous, electroless Ni—P plating film deposited on the catalyst nuclei layer 2.

In general, the c-Pd plating film is considered to have greater film stress and worse adhesion than the Ni—P plating film, but the Ni—P plating layer starts exhibiting influence of creation of nickel phosphide and crystallization of nickel after the heating temperature reaches approximately 100° C., and has a problem as to heat resistance, e.g., having a distinct diffraction peak at 300° C.

When the plated substrate is subject to heat, part of P in the Ni—P plating layer or the a-Pd plating layer provided on the metal Pd catalyst nuclei layer will diffuse into the metal Pd catalyst nuclei to form a palladium-phosphorus alloy.

At this time, the structure of the a-Pd plating layer formed on the catalyst nuclei layer is considered to have less stress on the catalyst nuclei layer and stronger adhesion of the plating layer to the glass substrate. In addition, by depositing the a-Pd plating film having the film thickness and the content of P as described in the present invention on the Pd catalyst nuclei layer, the circuit substrate having the plating wiring and electrodes can be fabricated without extreme roughing of glass surface and with very excellent adhesion to the glass substrate.

FIG. 1 shows a schematic diagram of the above structure, in which numeral 1 designates the glass substrate, 2 the catalyst nuclei layer mainly of metal Pd, and 3 the a-Pd plating layer.

In the case of the Ni—P plating onto the conventional glass, the glass surface was roughed in order to make up for insufficient adhesive force before the average surface roughness Ra of glass surface became approximately 0.4 $\mu$m; whereas, the present invention can achieve the adhesion equivalent to or greater than that of the roughed substrate, even if the surface is as smooth as Ra of about 0.002 $\mu$m.

Figure 2:
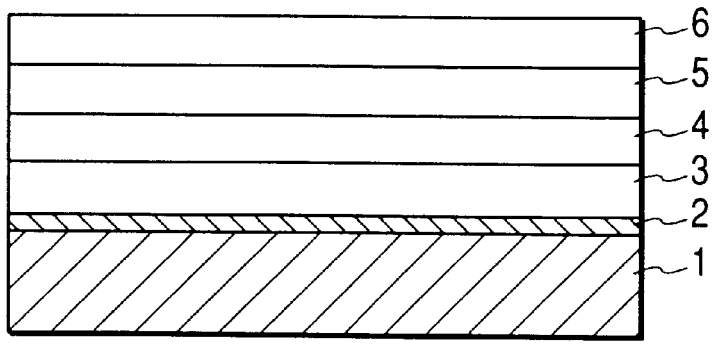
FIG. 2 is a schematic, cross-sectional view of a metallized glass substrate having the layer structure shown in Example 4 of the present invention.
Figure 3:
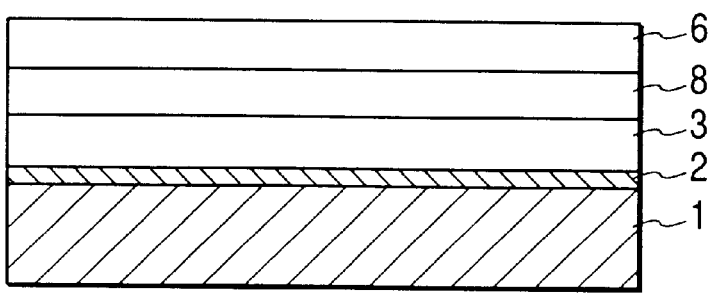
FIG. 3 is a schematic, cross-sectional view of a metallized glass substrate having the layer structure shown in Example 5 of the present invention.

Each of FIG. 2 and FIG. 3 is a schematic view to show an example of the layer structure of the present invention, showing a glass substrate in which a metal layer is deposited on the a-Pd plating layer and a circuit is formed.

In FIG. 2, numeral 1 denotes the glass substrate, 2 the aforementioned catalyst nuclei layer, 3 the a-Pd plating layer, 4 a Cu plating layer for low-resistance wiring, 5 an Ni plating layer for prevention of diffusion, and 6 an Au plating layer for prevention of oxidation.

An Ag plating layer can also be used in place of the above Cu plating layer 4, as shown in FIG. 3. In the same drawing, numeral 1 represents the glass substrate, 2 the aforementioned catalyst nuclei layer, 3 the a-Pd plating layer, 8 the Ag plating layer for low-resistance wiring, and 6 the Au plating layer for prevention of oxidation.

Here, FIG. 10 is a schematic view where after the conventionally used Ni—P plating layer was deposited instead of the above a-Pd plating film, layers of Cu, Ni, and Au were successively stacked thereon. The lamination in this layer structure often tends to readily induce peeling of film because of increase of stress due to the lamination and promote peeling of film with heating from the outside.

However, if the a-Pd plating layer is formed as a first layer on the catalyst nuclei as in the examples of the present invention, the stress due to lamination can be absorbed and high adhesive force can be maintained even upon heating, without any adhesion enhancing process such as roughing of glass surface or application of coupling agent.

Further, according to the present invention, when the c-Pd plating layer is deposited on the a-Pd plating layer, P diffuses from the a-Pd plating layer into the c-Pd plating layer, thereby obtaining the film structure with continuously gradient decrease of content of P. This gradient of content of P can be achieved by annealing the above laminate film at an appropriate temperature.

When the plating film formed on the catalyst nuclei layer is made as a gradient film as described above, a thermally and chemically stabler surface condition than that of the a-Pd single film can be achieved with little lowering the adhesive force of the a-Pd plating layer.

Namely, when compared with the Pd—P plating single film having the nearly amorphous structure, the stability of film is more enhanced against the substitution reaction upon lamination of different metals and attack of chemicals and the like and the resistance change due to heating is smaller than that of the Pd—P single film. The structure of the gradient film is thus especially effective for electroplating of metals such as Cu, Ni, Ni—P, Ag, Pd, Pd—P, Au, and Pt.

Figure 11:
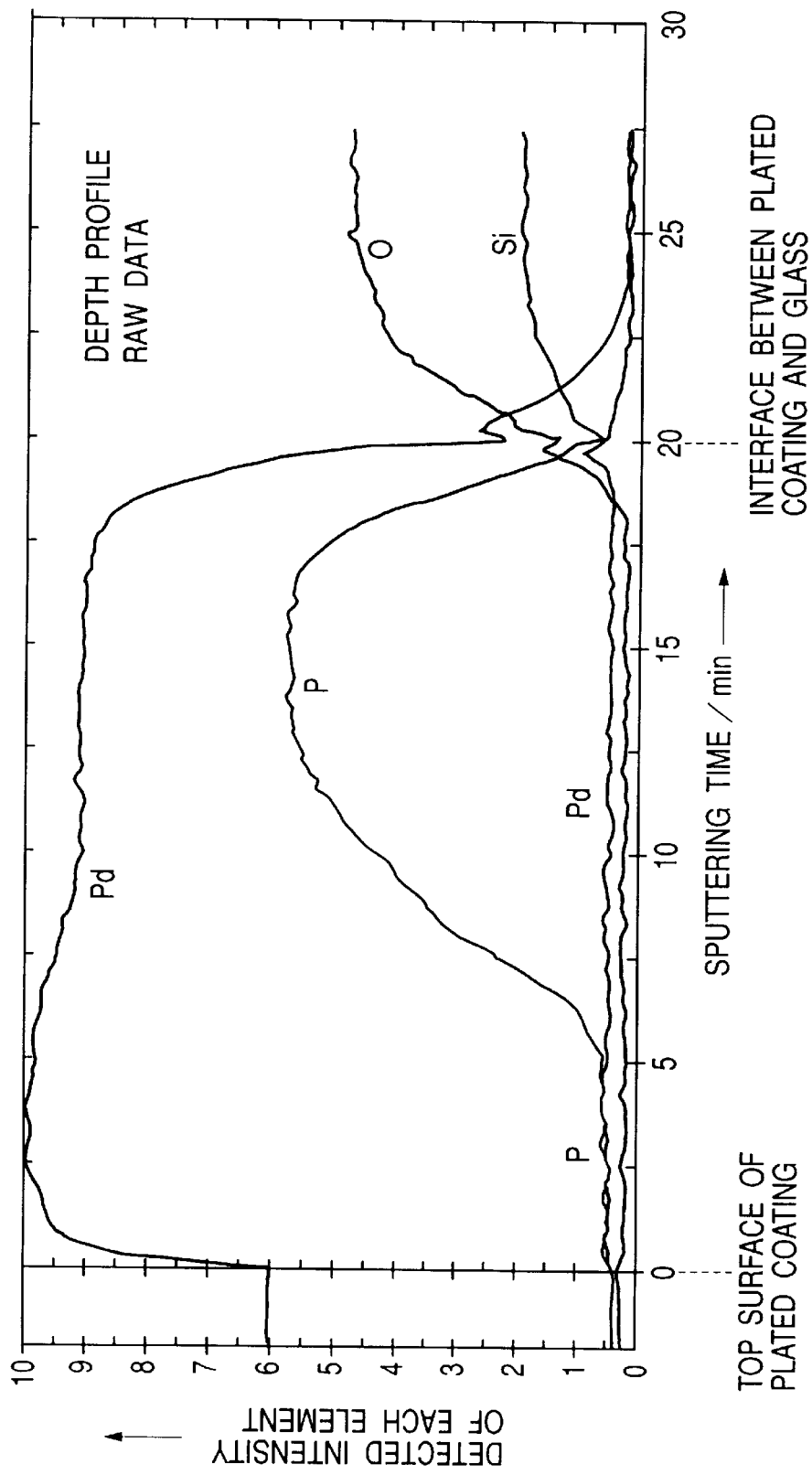
FIG. 11 is a drawing to show investigation results of intensity profile in the depthwise direction of P, obtained by depositing the plating layer of the present invention on float glass (blue sheet glass), subjecting it to an appropriate heat treatment, and thereafter analyzing the film by Auger electron spectroscopy (AES)

Here, Graph-1 shown in FIG. 11 is the result of investigation of the intensity profile in the depthwise direction of P, where the plating layer as claimed was deposited on float glass (blue sheet glass), it was subjected to an appropriate heat treatment, and the film was analyzed by Auger electron spectroscopy (hereinafter abbreviated as AES). It can be realized from the Graph-1 that the quantity of P is gradually changed as mentioned before.

From the result of observation by a transmission electron microscope (hereinafter referred to as TEM), thicknesses of the plating films of the substrate used for analysis were determined so that the thickness of the a-Pd plating layer was about 0.30 $\mu$m and the thickness of the c-Pd plating layer was about 0.25 $\mu$m (see photograph 1 shown as FIG. 12). In this connection, photograph 2 as referred to below is shown as FIG. 13.

The measurement conditions of AES and TEM are as follows.

[TEM Observation Conditions]

apparatus used H-9000 NAR (manufactured by Hitachi, Ltd.)

acceleration voltage 300 kV direct magnification ×300,000 (photograph 1 (FIG. 12))
        ×300,000 (photograph 2 (FIG. 13))

enlargement ratio ×5 (photograph 1 (FIG. 12))
        ×5 (photograph 2 (FIG. 13))

[AES Analysis Conditions]
   apparatus used PHI-660 type manufactured by PERKIN-ELMER
   acceleration voltage 3 kV
   of electron gun
   sample current about 100 nA
   ion species of ion gun $Ar^+$
   beam voltage 0.7 kV
   sputtering rate about 2 nm/min (when reduced to $SiO_2$)

The reason why the Pd plating layers having different contents of P, in other words, respectively having the nearly amorphous and polycrystalline film qualities, were deposited in the double layer structure as described is that formation of the c-Pd plating film almost polycrystalline as a first layer on the catalyst nuclei layer will increase the possibility of peeling occurring due to the film stress. Therefore, the a-Pd plating film with relatively small film stress was first formed, then the c-Pd plating film was deposited thereon, and relaxation of stress was effected by positively utilizing diffusion of P.

Namely, the film stress due to the difference in crystallinity between the two layers was relaxed by the gradient diffusion of P from the a-Pd plating layer into the c-Pd plating layer and by decrease of the total film thickness, thereby minimizing lowering of adhesion to the glass substrate. The c-Pd plating layer nearly polycrystalline shows the lower electric resistance than the a-Pd plating layer nearly amorphous and is also excellent in stability of surface of plating film. Thus, it is especially effective for electric pattern plating of metal such as a metal or an alloy of two or more selected from Cu, Ni, Ni—P, Ag, Pd, Pd—P, Au, and Pt as described previously.

Figure 4:
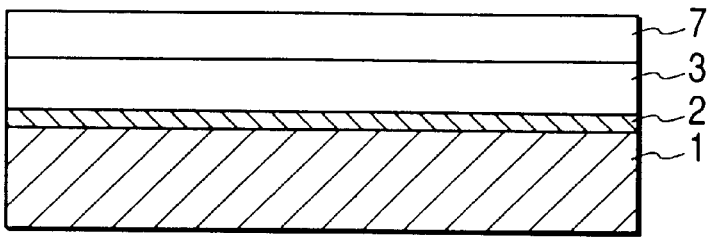
FIG. 4 is a schematic, cross-sectional view of a metallized glass substrate having the layer structure shown in Example 6, Example 7, and Example 8 of the present invention.

FIG. 4 is a schematic diagram of the Pd plating film having the double layer structure described above, in which numeral 1 denotes the glass substrate, 2 the catalyst nuclei layer mainly of metal Pd, 3 the a-Pd plating layer, and 7 the c-Pd plating layer.

Figure 5:
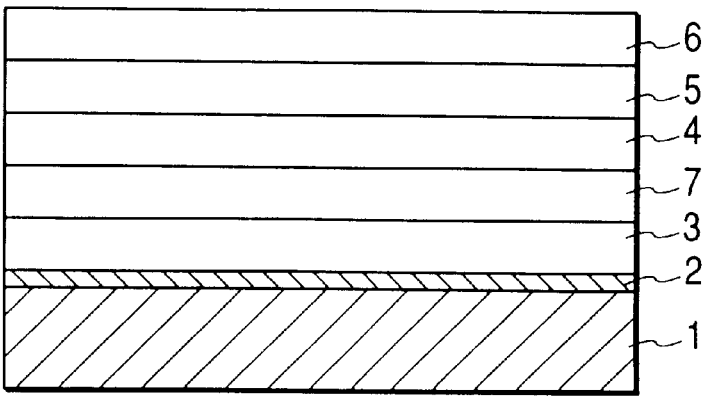
FIG. 5 is a schematic, cross-sectional view of a metallized glass substrate having the layer structure shown in Example 9 and Example 15 of the present invention.
Figure 6:
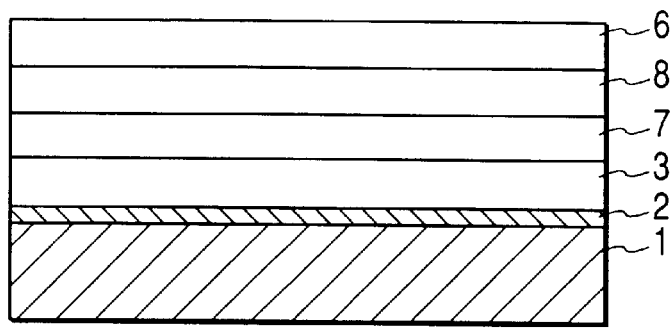
FIG. 6 is a schematic, cross-sectional view of a metallized glass substrate having the layer structure shown in Example 10 of the present invention.
Figure 7:
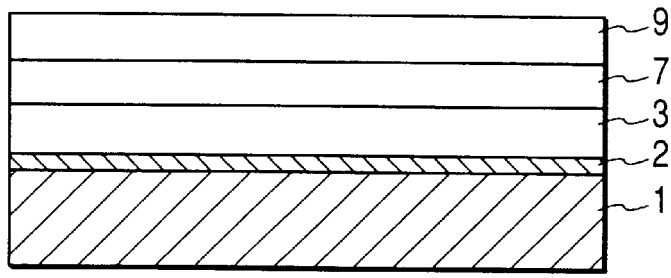
FIG. 7 is a schematic, cross-sectional view of a metallized glass substrate having the layer structure shown in Example 11, Example 12, Example 13, and Example 14 of the present invention.

Each of FIG. 5, FIG. 6, and FIG. 7 is a schematic drawing to show an example of the layer structure of the present invention, which is an example of the glass substrate in which metal layers or a metal layer is further deposited on the above c-Pd plating layer and a circuit is formed.

First, in FIG. 5, numeral 1 designates the glass substrate, 2 the aforementioned catalyst nuclei layer, 3 the a-Pd plating layer, 7 the c-Pd plating layer, 4 the Cu plating layer for low-resistance wiring, 5 the Ni plating layer for prevention of diffusion, and 6 the Au plating layer for prevention of oxidation.

Next, in FIG. 6, numeral 1 denotes the glass substrate, 2 the aforementioned catalyst nuclei layer, 3 the a-Pd plating layer, 7 the c-Pd plating layer, 8 the Ag plating layer for low-resistance wiring, and 6 the Au plating layer for prevention of oxidation.

Further, in FIG. 7, numeral 1 represents the glass substrate, 2 the aforementioned catalyst nuclei layer, 3 the a-Pd plating layer, 7 the c-Pd plating layer, and 9 a Pt plating layer.

As described above, by depositing the Pd plating layer containing a fixed amount of P in an appropriate thickness as a first layer on the catalyst nuclei layer, sufficient adhesion can be achieved with little roughing of glass substrate. Additionally, by further depositing the nearly crystalline Pd plating layer thereon, the Pd layer can be formed with the gradient of content of P, thereby enabling to achieve both the stability of film and the adhesion to the substrate.

Here, evaluation of adhesion of the plating layers on the glass circuit substrate in the present invention was conducted in the following manner. Specifically, a plating pattern of the size of 2 mm-by-2 mm square was made on a glass substrate of 100 mm×100 mm×thickness 1.1 mm, then a metal line of the diameter 1 mm was soldered to this pattern, and a vertical tension test was conducted using it, thereby evaluating adhesion between the glass substrate and the plating layer deposited thereon.

The adhesion by the vertical tension test was evaluated with an average of tension test results at twenty points, based on the following criteria.

Evaluation of adhesion Average of measurement results at 20 points
   good 2.5 kg/2 mm-by-2 mm square or higher
   mean 1.0 to 2.5 kg/2 mm-by-2 mm square
   no good 1.0 kg/2 mm-by-2 mm square or lower However, samples often experiencing breaking of substrate resulting from microcracks produced in the glass substrate, though exhibiting the above average over 1.0 kg/2 mm-by-2 mm square, were determined as inadequate in overall evaluation. The test results are shown in Table 1.

Heat tests described in the present invention were conducted according to the method described below.

The heat tests were conducted in such a way that 50 line patterns of the pattern width 80 μm and the length 60 mm were made on the aforementioned glass substrate, it was put in a belt furnace for baking it in an oxidizing atmosphere while always blowing fresh air onto the surface of substrate, and it was heated under such conditions as to achieve the maximum temperature 420° C. and the retention time 15 minutes.

When a sample showed peeling or breaking of even one pattern, it was determined as no good; when a sample showed neither peeling nor breaking of pattern, it was determined as good. The test results are shown in Table 2.

Figure 14:
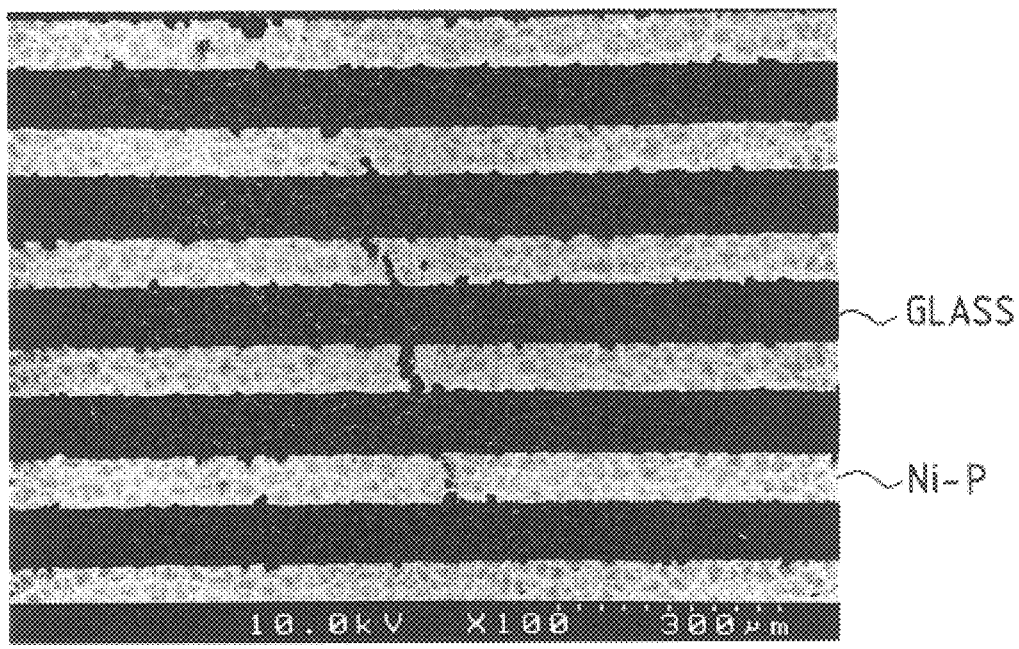
FIG. 14 is a drawing to show the metallographic structure by SEM photography of a glass circuit substrate in which Ni—P plating 0.1 $\mu$m thick is made and patterned on a prior art roughed glass substrate (the average surface roughness Ra: 0.4 $\mu$m)

Further, photograph 3 shown as FIG. 14 is an SEM photograph of a glass circuit substrate where an Ni—P plating 0.1 μm thick was deposited and patterned on a prior art roughed glass substrate (the surface roughness Ra: 0.4 μm). Photograph 4 shown as FIG. 15 is an SEM photograph of a glass circuit substrate where an a-Pd plating 0.1 μm thick was deposited and patterned on a glass substrate without roughing of surface according to the present invention (the surface roughness Ra: 0.002 μm).

In the SEM photographs portions appearing black indicate the glass substrate, whereas portions appearing white do the plated portions. The patterning method was common to the both substrates, the plating was made over the entire surface on the glass substrate, thereafter portions to be left as plating patterns were protected by a resist, and then etching was conducted to form the patterns.

As apparent from these photographs, the Ni—P plating patterns formed on the roughed glass substrate in photograph 3 shown as FIG. 14 show prominent breaking of plating in the shape of roughing pattern and in some portions the breaking continues to result in disconnection of pattern.

Figure 15:
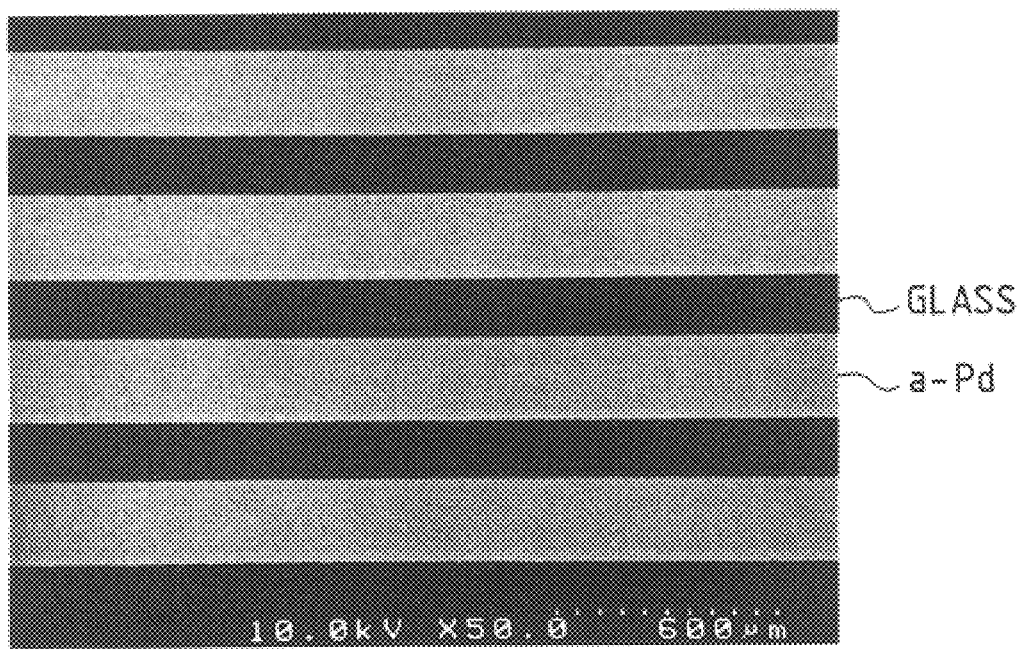
FIG. 15 is a drawing to show the metallographic structure by SEM photography of a glass circuit substrate in which a-Pd plating 0.1 $\mu$m thick is made and patterned on a glass substrate without roughing of surface (the average surface roughness Ra: 0.002 $\mu$m) according to the present invention.

In contrast with it, the a-Pd plating patterns formed on the glass substrate without roughing in photograph 4 shown as FIG. 15 show neither breaking nor disconnection, ensuring stable patterning.

The SEM measurement conditions were as follows. apparatus used S-3000 (manufactured by Hitachi, Ltd.)
   acceleration voltage 10 kV
   direct magnification ×100 (FIG. 14); ×50 (FIG. 15)

Table 3 shows the results of evaluation of resolution of line patterns formed based on the present invention in comparison with the conventional technology.

The substrate by the conventional technology was obtained by forming the catalyst nuclei on the glass substrate so roughed as to achieve the average surface roughness Ra of 0.4 μm and depositing an electroless Ni—P plating film thereon. In comparison with this substrate, the glass circuit substrate without extreme roughing of surface produced based on the present invention shows the excellent resolution even at the fine pattern width.

The evaluation of resolution was conducted as follows. Line patterns of 20 μm, 50 μm, and 100 μm 50 each were made on the entire surface of each plated product by photoetching process and evaluation was made based on the number of defective patterns.

It is seen from Table 3 that the patterns made by the conventional technology show sudden increase in the number of disconnected patterns when the pattern width becomes finer than 50 μm; whereas, the patterns made based on the present invention show that patterning can be done without any disconnection even if the pattern width is 20 μm.

As also apparent from these results of Table 1, Table 2, and Table 3, the substrate with the a-Pd plating film formed as a first layer on the catalyst nuclei exhibits excellent adhesive force when compared with the glass circuit substrate obtained by roughing the glass substrate, forming the catalyst nuclei thereon, and forming the Ni—P plating film as a first layer thereon, and it is also free of the problem of occurrence of microcracks in the surface of glass substrate which would occur upon roughing, because the sufficient adhesion can be achieved without extreme roughing. In addition, patterning of fine line can be conducted far stabler than on the roughed substrate.

A material for the glass substrate 1 used in the glass circuit substrate in the present invention can be selected from alkali-containing glass known in general as blue sheet glass (an example of which is trade name U.F.F Glass available from Nippon Sheet Glass Co., Ltd.), glass little containing alkali, such as borosilicate glass (an example of which is trade name #7059 available from Corning Corp.), glass coated with $SiO_2$ or the like (an example of which is trade name H coat glass available from Nippon Sheet Glass Co., Ltd.), and so on.

Prior to plating on the glass substrate, the substrate is first cleaned with a degreasing agent and then the surface is provided with the catalyst nuclei for plating. The catalyst nuclei provided on the glass substrate are preferably of a metal mainly containing metal Pd and can be made by a known method. The catalyst nuclei are preferably provided uniformly and closely over the surface of glass substrate.

The degreasing of substrate can be carried out using either a solvent-based cleaning agent or a water-based cleaning agent. Water-based glass cleaning agents suitably applicable include trade names $P_3$ siliron HS, $P_3$ siliron L (available from Henkel Hakusuisha), trade name OPC-380 Condiclean M (available from Okuno Seiyaku), trade name Melcleaner ITO-170 (available from Meltex Corp.), and so on.

The method for forming the catalyst nuclei on the substrate can be selected from the method for substituting Sn adsorbing to the surface of substrate for Pd to make the catalyst nuclei, the method for making the Pd—Sn colloid adsorb to the surface of substrate and thereafter removing Sn to form the catalyst nuclei, the method for making an Sn-free Pd complex adsorb to the surface of substrate and thereafter reducing it to form the catalyst nuclei of metal Pd of zerovalence, and so on, either one of which may be selected according to the condition of substrate.

An example of practical pretreatment steps will be described in further detail.

The cleaning step was first conducted as follows. The glass substrate was dipped in an organic solvent such as isopropyl alcohol (hereinafter referred to as IPA), then the substrate was dipped and cleaned in a water-soluble degreasing agent (trade name: Melcleaner ITO-170 available from Meltex Corp.) under the conditions of the liquid concentration 15 g/l, the liquid temperature 50° C., and ultrasonic irradiation for five minutes, the substrate was then washed with ion-exchanged water, thereafter the substrate was dipped in potassium hydroxide solution of the concentration 70 g/l and the liquid temperature 70° C. under ultrasonic irradiation for five minutes, and it was washed with ion-exchanged water.

For next forming the metal Pd nuclei, the substrate was first dipped at 25° C. in a sensitizing solution of pH 1 containing 0.06 g/l of stannous chloride for three minutes, thereby making $Sn^{2+}$ adsorb to the surface of glass.

After washing it, it was dipped at 25° C. in an activation solution containing 0.1 g/l of $PdCl_2$ for five minutes to substitute Sn on the substrate for Pd. After washing it, it was dipped in an electroless Pd plating solution.

Here, an electroless Pd plating solution containing a reducing agent of sodium hypophosphite may be used for forming the a-Pd plating layer as a first layer on the above Pd catalyst nuclei layer in the present invention.

The plating layer having the thickness and the content of P as described in the present invention can be formed by properly setting the composition of this electroless Pd plating solution and the plating conditions.

The above electroless Pd plating solution may be a plating solution of a known composition or one of commercially available solutions. Specific examples of the commercially available chemicals suitably applicable include trade name Muden Noble PD (available from Okuno Seiyaku), trade name Unicon electroless palladium-phosphorus APP plating bath (available from Ishihara Yakuhin), and so on.

An example of a fundamental bath of a known composition is the one described below.

It is a bath containing $PdCl_2$ as a metal salt, ethylene diamine as a complex-forming agent, thioglycolic acid as a stabilizer, and sodium hypophosphite as a reducing agent.

In addition to the above, electroless Pd plating solutions known are those using sodium phosphite, hydrazine, or dimethylamine borane as a reducing agent and triethylenetetramine as a complex-forming agent.

Based on these, the catalyst nuclei mainly of metal Pd are formed over the entire surface or in a part on the glass substrate so that the average surface roughness Ra is from 0.0010 (μm) to 0.10 (μm), preferably from 0.0012 (μm) to 0.050 (μm), according to the present invention. Further, the a-Pd plating layer is deposited on the catalyst nuclei while selecting the plating solution and the plating conditions so that the thickness thereof is from 0.015 (μm) to 0.50 (μm), preferably from 0.020 (μm) to 0.40 (μm) and so that the content of phosphorus thereof is from 3.0 (wt %) to 10.0 (wt %), preferably from 3.5 (wt %) to 9.0 (wt %), thereby obtaining the glass circuit substrate with excellent characteristics.

Under these conditions the a-Pd plating layer was formed on one surface of blue sheet glass fabricated by the float process and a cross section thereof was observed by TEM. An example of the result of TEM observation is shown in photograph 2 in FIG. 13.

Figure 13:
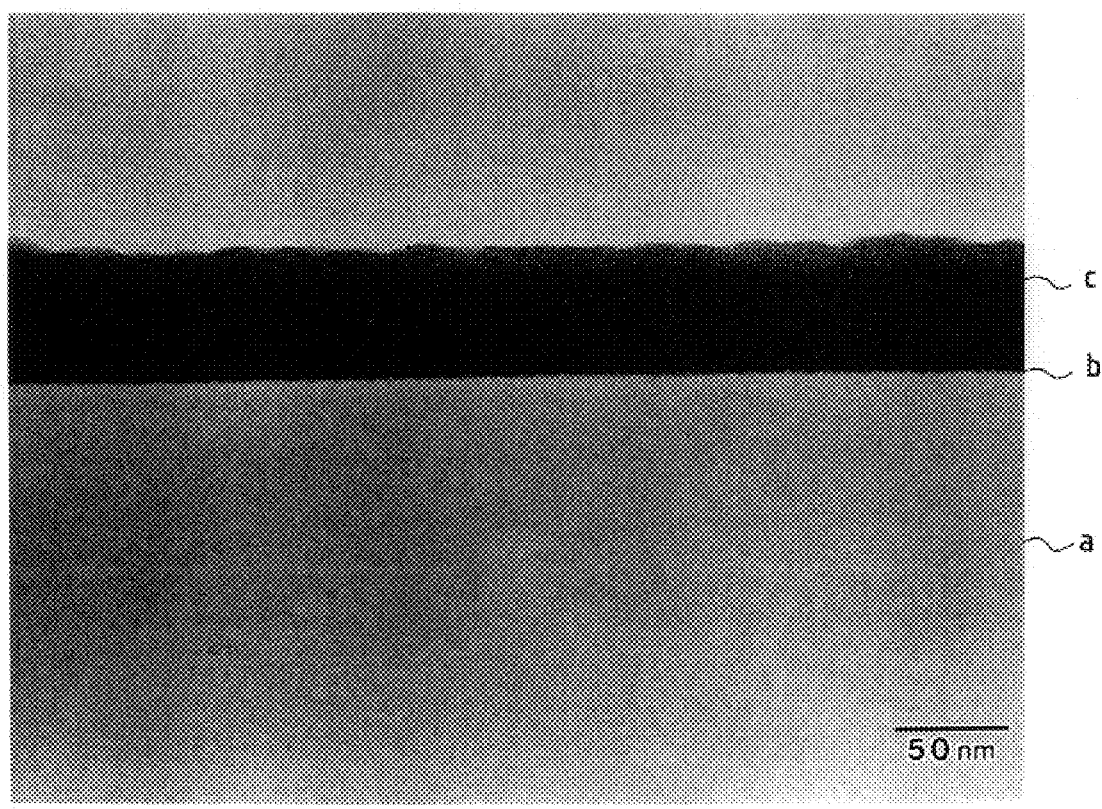
FIG. 13 is a drawing to show an example of metallographic structure as a result of cross-sectional observation by TEM of an a-Pd plating layer formed on one surface of blue sheet glass fabricated by the float process.

In photograph 2 shown in FIG. 13, "a" indicates the blue sheet glass, "b" the catalyst nuclei layer mainly of metal Pd, and "c" the a-Pd plating layer. It is observed from the photograph that the glass substrate is kept still smooth even after the formation of the plating layer.

According to the present invention, patterns of wiring, electrodes, etc. are further formed, if necessary, on the a-Pd plating layer formed on the glass substrate by patterning, etching, and the like, and a plating film of one or more selected from Cu, Ni, Ni—P, Ag, Pd, Pd—P, Au, and Pt is deposited thereon, thereby obtaining the glass circuit substrate with excellent characteristics.

Further, according to the present invention, the catalyst nuclei mainly of metal Pd are formed over the entire surface or in a part on the glass substrate the average surface roughness Ra of which is from 0.0010 ($\mu$m) to 0.10 ($\mu$m), preferably from 0.0012 ($\mu$m) to 0.050 ($\mu$m), the a-Pd plating layer the thickness of which is from 0.015 ($\mu$m) to 0.50 ($\mu$m), preferably from 0.020 ($\mu$m) to 0.40 ($\mu$m), and the content of P of which is from 3.0 (wt %) to 10 (wt %), preferably from 3.5 (wt %) to 9.0 (wt %), is further formed on the catalyst nuclei, it is patterned by photolithography, etching, and the like, if necessary, and the c-Pd plating layer the thickness of which is from 0.015 ($\mu$m) to 0.25 ($\mu$m), preferably from 0.020 ($\mu$m) to 0.20 ($\mu$m) and the content of P of which is from 0 to 1.0 (wt %), preferably from 0 to 0.5 (wt %) is deposited over the entire surface or in a part thereof, thereby obtaining the glass circuit substrate with excellent characteristics.

Under these conditions, the substrate was formed by depositing the a-Pd plating layer and the c-Pd plating layer on one surface of blue sheet glass fabricated by the float process and the cross section thereof was observed by TEM. An example of the result of observation is shown in photograph 1 in FIG. 12.

Figure 12:
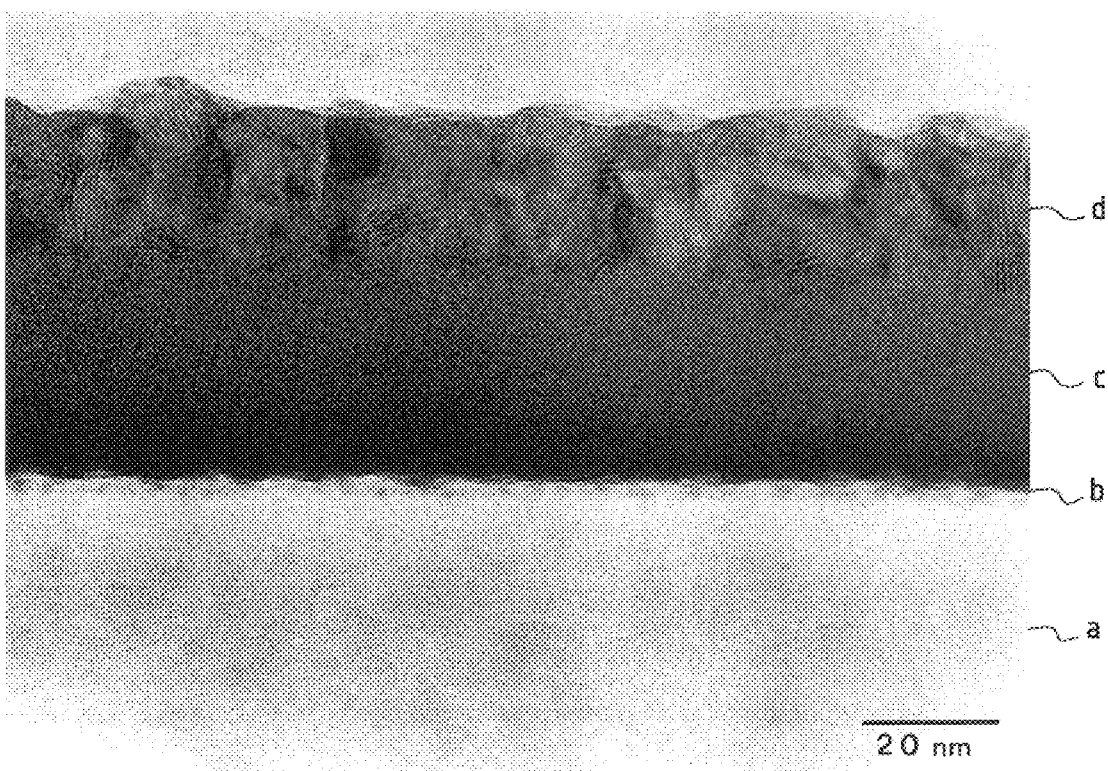
FIG. 12 is a drawing to show an example of metallographic structure of a cross section by TEM of a substrate in which an a-Pd plating layer and a c-Pd plating layer are formed on one surface of blue sheet glass fabricated by the float process.

In photograph 1 shown in FIG. 12, "a" indicates the blue sheet glass, "b" the catalyst nuclei layer mainly of metal Pd. "c" the a-Pd plating layer, and "d" the c-Pd plating layer. It is observed from the photograph that the glass substrate is kept still smooth even after the formation of the plating layers.

In addition, according to the present invention, the wiring and electrodes are formed, if necessary, on the c-Pd plating layer formed on the glass substrate by patterning, etching, and the like and thereafter a plating layer of at least one selected from Cu, Ni, Ni—P, Ag, Pd, Pd—P, Au, and Pt is deposited over the entire surface or in a part, thereby making the glass circuit substrate having the plating wiring and electrodes.

By depositing the Pd plating layer with little P on the Pd plating layer containing P in this way, stability of the Pd film against the substitution reaction and chemicals can be enhanced without degrading the adhesion of Pd film.

For example, if a nobler metal species such as Pt than Pd is deposited on the a-Pd plating layer, the substitution reaction readily takes place between them and not only the a-Pd plating layer but also the catalyst nuclei layer would be damaged, thus often degrading the adhesion greatly.

Namely, since the a-Pd plating layer is in a very active state, it is likely to be subject to substitution in the plating solution and to attack of the complex-forming agent in the plating bath. On this occasion, if the a-Pd plating layer is a thin film as in the present invention, the damage will often advance not only in the a-Pd plating layer, but also into the catalyst nuclei layer underneath it.

For preventing this damage from going into the catalyst nuclei layer without extreme increase of the thickness of the Pd plating layer, the deposition of the c-Pd plating layer on the a-Pd plating layer as in the present invention is effective.

The reason is that the c-Pd plating layer with nearly crystalline quality containing little P has high resistance to the above attack in the plating solution as compared with the nearly amorphous a-Pd plating layer. When compared with the method for preventing the damage on the catalyst nuclei by increasing the thickness of the a-Pd plating layer, the method for depositing the c-Pd plating layer on the a-Pd plating layer can keep the total thickness smaller and the stress of film less, thus making degradation of adhesion less.

In addition, by the lamination of the c-Pd plating layer with nearly crystalline quality, P diffusing from the a-Pd plating layer during the heat treatment step can be trapped in this c-Pd plating layer.

Further, by positively utilizing the diffusion of P while selecting appropriate heat treatment conditions, the laminate film can be made so as to continuously change P across the above two layers, that is, so as to exhibit the gradient decrease in the contents of P toward the top. This can relax the stress due to the lamination of the a-Pd plating layer dominated by amorphous nature and the c-Pd plating layer containing little P dominated by crystalline nature, thereby realizing the decrease in the film stress.

Chemical plating solutions and electroplating solutions applicable in the present invention are those well known. Examples of such solutions are as follows.

| Name of commercially available solution | Name of product | Selling company |
|---|---|---|
| electroless Pd-P plating solution | Muden Noble PD | Okuno Seiyaku K. K. |
| electroless Pd plating solution (not containing P) | PARED | Kojima Kagaku Yakuhin K. K. |
| electric Pd plating solution | K-pure palladium | Kojima Kagaku Yakuhin K. K. |
| electroless Ni-P plating solution | Melplate Ni-422 | Meltex K. K. |
| electroless Cu plating solution | Enplate Cu-406 | Meltex K. K. |
| electric Ag plating solution | Silver glow-3K | Nippon Reelonal K. K. |
| electroless Au plating solution | OL III electroless Au plating solution | Kojima Kagaku Yakuhin K. K. |
| electroless Pt plating solution | EL-PLATINUM · 206 | N. E. Chemcat, K. K. |
| electric Pt plating solution | Pt-255 | N. E. Chemcat, K. K. |
| electric copper plating solution | copper sulfate | 75 g/l |
| | sulfuric acid | 190 g/l |
| | chlorine ion | 50 ppm |
| | copper greem | 5 ml/l |
| | CLX-A | Nippon Reelonal K. K. |
| | copper greem | 5 ml/l |
| | CLX-C | Nippon Reelonal K. K. |
| electric nickel plating solution | nickel sulfamate | 410 g/l |
| | nickel chloride | 30 g/l |
| | boric acid | 37 g/l |
| | Nycal PC-3 | 30 ml/l |
| | | Nippon Reelonal K. K. |
| | Nycal-W | 0.3 ml/l |
| | | Nippon Reelonal K. K. |
| electric nickel plating solution | nickel sulfate | 350 g/l |
| | nickel chloride | 45 g/l |
| | boric acid | 47 g/l |
| | Nycal PC-3 | 30 ml/l |
| | | Nippon Reelonal K. K. |
| | Nycal-W | 0.3 ml/l |
| | | Nippon Reelonal K. K. |

It is noted that plating solutions made using well-known compositions can also be used, in addition to the commercially available solutions.

An example is an electroless Pd—P plating solution containing ethylene diamine as a complex-forming agent and sodium hypophosphite as a reducing agent, as described in Hyomen Gijutsu (Surface Technology) vol. 40, No. 3, 1989, p 123–126.

It is, however, noted that the above solutions are only some examples and that chemicals and plating solutions applicable in the present invention are not limited to the above examples.

References are listed below.

Journal of Japan Institute of Printed Circuit "Circuit Technology" 7 (4), P363–271 (1992)

Journal of Japan Institute of Printed Circuit "Circuit Technology" 7 (6), P369–376 (1992)

Hyomen Gijutsu vol. 44, No. 5, P425–429 (1993)

Hyomen Gijutsu vol. 44, No. 12, P136–139 (1993)

Hyomen Gijutsu vol. 42, No. 11, P90–95 (1991)

Hyomen Gijutsu vol. 40, No. 3, P477–480 (1989)

Incidentally, the vertical tensile strength of plating film is measured for evaluating adhesion (adhesive strength) of plating film. Specifically, a plating film is formed on a glass substrate of 100 mm×100 mm and the thickness 2.8 mm, it is patterned to form a plating film pattern 2 mm-by-2 mm square, a metal line of the diameter 1 mm is soldered to this pattern, and force is measured upon peeling of the plating film while vertically pulling the metal line. The adhesion is evaluated for an average of measured values of peeling force at twenty patterns, for example, based on the following criteria for evaluation.

Good if the peeling force is not less than 1.0 kgf/2 mm-by-2 mm square.

No good if the peeling force is less than 1.0 kgf/2 mm-by-2 mm square.

When the PdP electroless plating film is formed in 0.1 μm on the non-roughed glass substrate, the adhesive force of the PdP electroless plating film to the glass substrate is good, 2.5 kgf/2 mm-by-2 mm square or more. However, when the Ag electroplating film is formed in 2 μm on the PdP electroless plating film, the adhesive force of the plating film to the glass substrate is decreased to 0.8 kgf/2 mm-by-2 mm square.

When the PdP electroless plating film is formed in 0.3 μm on the non-roughed glass substrate, the adhesive force of the PdP electroless plating film to the glass substrate is good, 2.5 kgf/2 mm-by-2 mm square or more. When the Ag electroplating film is formed in 2 μm on the PdP electroless plating film, the adhesive force of the plating film to the glass substrate is also good, 2.5 kgf/2 mm-by-2 mm square or more.

When the PdP electroless plating film is formed in 0.5 μm on the non-roughed glass substrate, the adhesive force of the PdP electroless plating film to the glass substrate is still good, 1.5 kgf/2 mm-by-2 mm square, which is, however, lowered from that in the case of 0.3 μm.

The reason thereof is presumably as follows. When the PdP electroless plating film is formed on the non-roughed glass substrate and the Ag electroplating film is formed thereon, hydrogen gas generated upon electroplating is occluded in the PdP electroless plating film. When the thickness of the PdP electroless plating film is thin as 0.1 μm, the hydrogen reaches the vicinity of the interface between the glass substrate and the PdP electroless plating film contributing to the adhesion, so that peeling is considered to easily occur at the interface between the glass substrate and the PdP electroless plating film. On the other hand, when the thickness of the PdP electroless plating film is 0.3 μm, the hydrogen gas generated upon electroplating is also occluded in the PdP electroless plating film, but the hydrogen does not substantially reach the interface between the glass substrate and the PdP electroless plating film. Therefore, peeling is not likely to occur at this interface and the PdP electroless plating film is thus considered to effectively function as a stress-relaxing layer between the glass substrate and the electroplating film. However, when the thickness of the PdP electroless plating film is as thick as 0.5 μm, the adhesive force tends to decrease because of the film stress of this electroless plating film itself.

An effective structure is thus constructed in such a way that PdP is deposited by electroless plating on the non-roughed glass substrate to form the PdP film, a metal plating is deposited on the PdP film to form a metal film, and it is heated to make a mutual diffusion layer of the glass component forming the glass substrate, the PdP, and the metal.

Since the plating films of such a glass circuit substrate include only a small amount of impurities, the resistance of the substrate can be readily decreased as compared with the conventional glass wiring substrate by printing. In the case of the conventional glass wiring substrate obtained by forming a plating on an ITO film or a metal film formed on the aforementioned glass substrate, when the film thickness of plating becomes over about 2 to 3 μm, the plating layer, together with the undercoat film such as the ITO film, is often peeled off entirely from the glass substrate because of the film stress of the plating film itself. In contrast, the glass wiring substrate of the present invention is enhanced in the adhesive force, because the plating metal film itself diffuses into the glass by the mutual diffusion.

Figure 16:
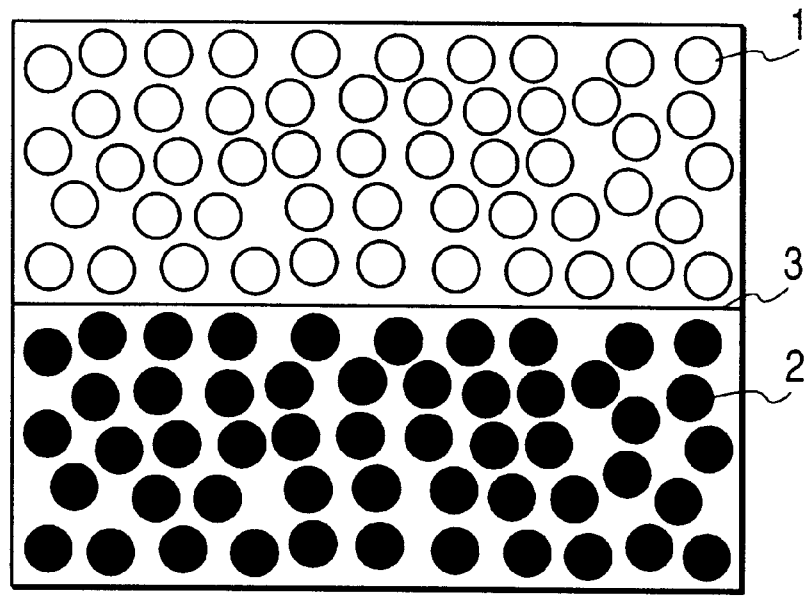
FIG. 16 is a schematic diagram to show a state near the interface between the glass substrate and a plating lamination of electroless plating PdP film and plating metal film.
Figure 17:
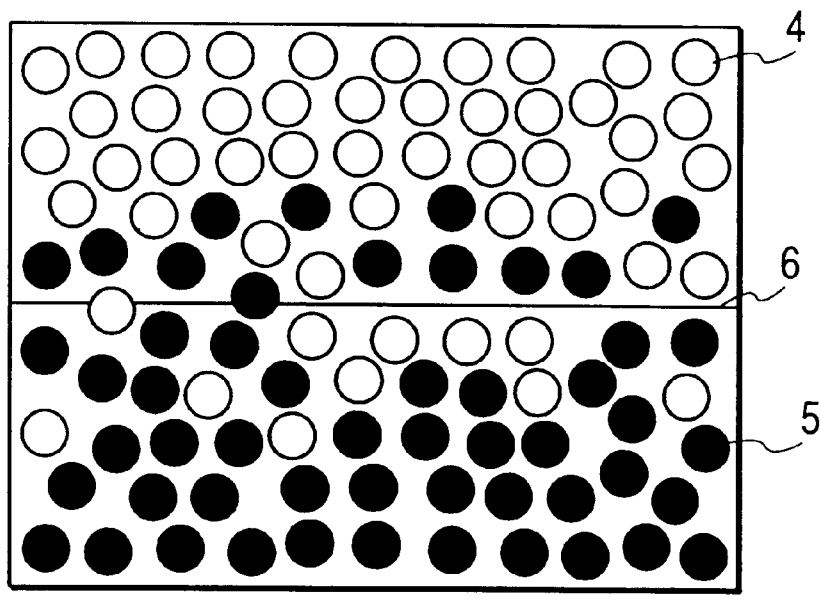
FIG. 17 is a schematic diagram to show a state after a heat treatment of the part of FIG. 16.

FIG. 16 is a schematic drawing to show the vicinity of the interface between the glass substrate and the plating lamination of the electroless plating PdP film and plating metal film and FIG. 17 is a schematic drawing to show a state of this part after heated. In FIG. 16 and FIG. 17, numerals 1, 4 indicate metal atoms constituting the PdP film and the metal film forming the plating lamination, 2, 5 atoms constituting the glass substrate, and 3, 6 the interface between the glass substrate and the plating lamination.

As shown in FIG. 16, when the plating lamination is formed on the glass substrate, interface 3 exists as shown in FIG. 16. However, when it is subjected to the heat treatment, the atoms (ions) forming the glass substrate and plating lamination start moving and the interface 3 clearly seen in FIG. 16 becomes unclear as shown in FIG. 17. This mutual diffusion can form the plating film on the non-roughed glass with far greater adhesive force than that of the plating formed on the ITO film. This technique allows us to obtain high adhesion using the non-roughed glass, thus obviating the need for roughing of glass substrate, which was needed heretofore.

In an embodiment of the present invention the metal film is a laminate film comprised of a stack of metal layers.

In an embodiment of the present invention the aforementioned metal is at least one of Ag and Au. Particularly, the metal film can be a laminate film of an Ag film and an Au film formed thereon and in this case surface oxidation can be suppressed, thereby preventing roughness of surface.

In an embodiment of the present invention an alloy of the PdP and the metal is formed in the mutual diffusion layer.

In an embodiment of the present invention the thickness of the mutual diffusion layer is between 200 nm and 2000 nm. Within this range, even if the wiring metal is deposited in the thickness of about several μm, peeling thereof will not occur. When wires are formed in line and space patterns of 10 μm of the metal layer, degradation of insulation between wires due to metal diffusion can be prevented. If the thickness of the mutual diffusion layer is too small, sufficient adhesion cannot be attained so as to raise a possibility of occurrence of peeling. If the thickness of the mutual diffusion layer is too large, a possibility of degradation of insulation will increase.

In an embodiment of the present invention the temperature of the heat treatment is between 400° C. and 500° C. If the temperature of the heat treatment is too low, sufficient diffusion will not be achieved and the heat treatment will need a long time. If the temperature of the heat treatment is too high, diffusion of metal atoms will be excessive into the glass substrate, which would degrade the insulation, color the glass substrate, or make control of the heat treatment difficult.

In an embodiment of the present invention the PdP film is formed in a pattern on the glass substrate and the metal layer is formed in the same pattern on the PdP film.

Figure 24:
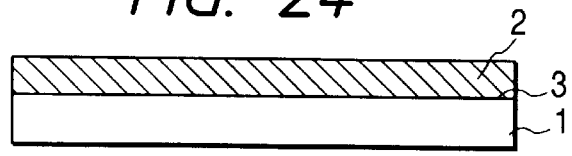
FIG. 24 is a schematic, cross-sectional view to show a state of an electroless plating film on a non-roughed substrate according to an embodiment of the present invention.
Figure 25:
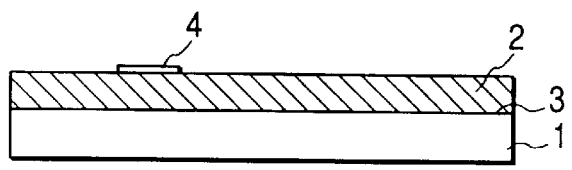
FIG. 25 is a schematic, cross-sectional view to show a state in which an electrode is further provided on the surface of the electroless plating film on the non-roughed substrate, similarly.

Incidentally, FIG. 24 schematically shows a state of an electroless plating on a non-roughed glass substrate. In the drawing numeral 1 designates the non-roughed glass substrate, 2 the electroless plating film, and 3 the interface between the glass substrate 1 and the electroless plating film 2. With this glass wiring substrate, when noble metal electrode 4 is formed on the electroless plating film 2 formed on the non-roughed glass substrate 1 as shown in FIG. 25, the negative effect of the electroless plating film being an undercoat film as described in the conventional example does not appear and configuration accuracy is also satisfactory.

FIGS. 26A to 26F are schematic views to show the flow of a fabrication process of a glass wiring substrate according to the present invention. As described previously, the electroless plating film 2 is formed on the non-roughed glass substrate 1 (see FIG. 26A), and a photoresist 5 is deposited thereon (see FIG. 26B).

Figure 26A:
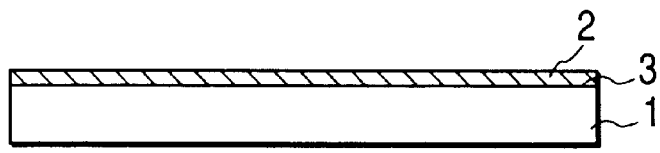
FIGS. 26A, 26B, 26C, 26D, 26E and 26F are views to show the flow of fabrication process for fabricating the glass wiring substrate according to the present invention.
Figure 26B:
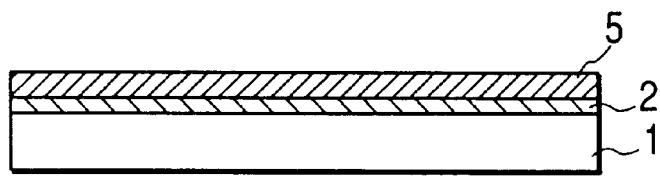
Figure 26C:
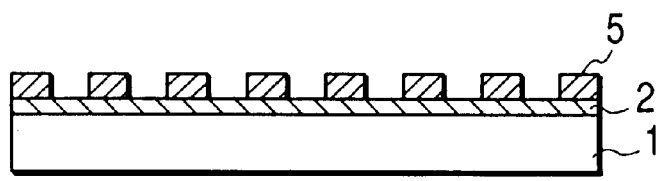
Figure 26D:
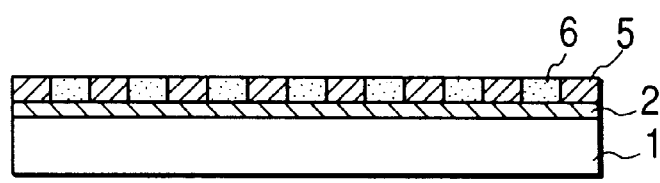
Figure 26E:
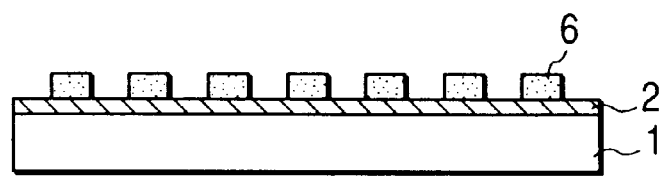
Figure 26F:
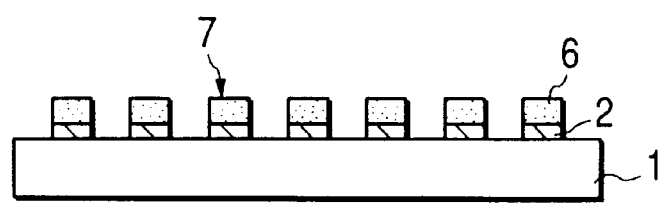

Then exposure and development (patterning) is effected (see FIG. 26C) and thereafter, using the remaining resist as a plating resist, electroplating 6 is made on exposed surfaces of the electroless plating film 2 (see FIG. 26D). Then the resist 5 is peeled off (see FIG. 26E) and unnecessary portions of the undercoat layer (exposed portions of the electroless plating film 2) are removed by etching (see FIG. 26F), thereby completing the glass wiring substrate in which the electroconductive layer 7 with high adhesion is formed on the non-roughed glass substrate 1.

In this case, since the plating wiring is deposited in an almost pure metal state, the wiring can be made with a resistance being a fraction of that of the wiring made by baking of metal paste by the technique of printing or the like. Further, since upon this patterning some of mounting portions of electronic parts can also be patterned simultaneously as well as the formation of wiring for forming a screen of display, this makes possible mounting of electronic parts on the glass wiring substrate for display (see FIG. 27). In this figure numeral 9 denotes the wiring part of display screen, 10 electrodes for mounting of electronic parts, 11 terminal electrodes for lead-out, and 12 a wiring area (the inside of which is not illustrated) for mounting of electronic parts.

When the electroless plating is formed on the non-roughed glass substrate by the conventional technique, the adhesion is not sufficient and the plating film is often peeled off from the substrate in the subsequent photolithography step. In contrast, the above-stated fabrication method of the present invention assures the adhesion of plating film and also permits more uniform electroplating to be made on the electroless plating film being the wiring undercoat layer. In the present invention, when electroplating is made on the glass substrate with the patterned undercoat layer, the deposited layer can be made with low resistance necessitated as a specification of large screen display and with sufficient heat resistance.

The present invention will be described in further detail with specific examples, but it is noted that the present invention is by no means intended to be limited to these examples.

EXAMPLE 1

Float blue sheet glass of 100 mm×100 mm×thickness 1.1 mm (available from Nippon Sheet Glass Co., Ltd.) was prepared as a glass substrate, it was dipped in IPA under ultrasonic irradiation for five minutes, then it was dipped in Melcleaner ITO-170 available from Meltex K.K. being a water-soluble degreasing agent (the liquid concentration 15 g/l and the liquid temperature 50° C.) under ultrasonic irradiation for five minutes, it was then washed with ion-exchanged water, it was further dipped in the potassium hydroxide solution (the concentration 70 g/l and the liquid temperature 70° C.) under ultrasonic irradiation for five minutes, and it was then washed with ion-exchanged water, then ending the degreasing step.

Subsequently, the substrate was dipped in an aqueous solution of pH 1 and bath temperature 25° C. containing 0.06 g/l of stannous chloride ($SnCl_2$), was washed in ion-exchanged water, was dipped in an aqueous solution containing 0.1 g/l of palladium chloride ($PdCl_2$) at 25° C. for five minutes, and was washed with ion-exchanged water, then ending the catalyst nuclei forming step.

This substrate was subjected to electroless plating with trade name Muden Noble PD available from Okuno Seiyaku.

The plating was conducted at the bath temperature 55° C. and the substrate was dipped in the solution before the thickness became 0.1 μm, thereby forming the a-Pd plating film over the entire surface on the glass substrate.

At this time, the other plating conditions were so set that the content of P in the a-Pd plating layer became 8 wt %.

The plating film formed in this way had the nearly amorphous film structure as seen in the cross-sectional TEM photograph 2 shown as FIG. 13.

Next, a resist patter was formed on this plating film by the photo process, and the substrate was further dipped in an etchant prepared in the composition of 70% nitric acid: 35% hydrochloric acid: acetic acid=9:9:1, thereby forming the pattern for the heat test and resolution test.

The plating layer obtained as described above was subjected to the peeling test by tape, but no peeling of film was observed and the heat resistance and resolution thereof were also excellent. The test results are shown in Table 1, Table 2, and Table 3.

At this time, the average surface roughness Ra of the glass substrate at the end of the degreasing step was 0.0020 μm and Ra of the glass substrate after removal of this plating film by etching was also the same value.

EXAMPLE 2

The pattern of the Pd—P plating film was formed under the same conditions as in Example 1 except that trade name #7059 available from Corning Corp. was used as the glass substrate.

When the plating layer obtained as described above was subjected to the peeling test by tape, no peeling of film was observed and the heat resistance and resolution thereof were also excellent. The test results are shown in Table 1, Table 2, and Table 3.

At this time, the average surface roughness Ra of the glass substrate at the end of the degreasing step was 0.0013 μm and Ra of the glass substrate after removal of this plating film by etching was also the same value.

EXAMPLE 3

The glass substrate used herein was H coat glass available from Nippon Sheet Glass, obtained by coating the blue sheet glass with $SiO_2$. The pattern of deposit film was formed under the same conditions as in Example 1 except for the glass substrate.

When the plating layer obtained as described above was subjected to the peeling test by tape, no peeling of film was observed and the heat resistance and resolution thereof were also excellent. The test results are shown in Table 1, Table 2, and Table 3.

At this time, the average surface roughness Ra of the glass substrate at the end of the degreasing step was 0.0025 μm and Ra of the glass substrate after removal of this plating film by etching was also the same value.

EXAMPLE 4

Using the same glass substrate as in Example 1, the substrate was subjected to the same pretreatment as in Example 1, thereafter the a-Pd plating layer was deposited in the thickness of 0.07 μm and with the content of P of 7 wt %, the line pattern was made using the same photo-etching process as in Example 1, Cu was deposited 5 μm by electroplating, Ni 3 μm by electroplating, and Au 0.03 μm by displacement plating.

The results of the tension test and heat test of the plating layer obtained as described above were good and the results are shown in Table 1 and Table 2.

At this time, the average surface roughness Ra of the glass substrate at the end of the degreasing step was 0.0020 μm and Ra of the glass substrate after removal of this plating film by etching was also the same value.

EXAMPLE 5

Using the same glass substrate as in Example 1, the substrate was subjected to the same pretreatment as in Example 1, thereafter the a-Pd plating layer was deposited in the thickness of 0.11 μm and with the content of P of 8 wt %, and the line pattern was made using the same photo-etching process as in Example 1. Further, Ag was deposited 3 μm by electroplating on this pattern and Au was further deposited 1.5 μm thereon.

The results of the tension test and heat test of the plating layer obtained as described above were good and the results are shown in Table 1 and Table 2.

At this time, the average surface roughness Ra of the glass substrate at the end of the degreasing step was 0.0027 μm and Ra of the glass substrate after removal of this plating film by etching was also the same value.

EXAMPLE 6

Using the same glass substrate, pretreatment, and plating solution as in Example 1, the a-Pd plating layer was formed as a first layer on the catalyst nuclei layer and the c-Pd plating layer containing neither phosphorus nor boron was deposited on the a-Pd plating layer.

The plating solution used herein was trade name PARED available from Kojima Kagaku Yakuhin, and film formation was carried out at the liquid temperature 60° C. The line pattern was formed in this laminate film using the same photo-etching process as in Example 1 and it was cleaned and then retained at the maximum temperature 150° C. in the aforementioned belt furnace for three hours.

At this time, the content of P in the a-Pd plating layer was 8 wt % and the thickness thereof was 0.03 μm. The thickness of the c-Pd plating layer deposited thereon was 0.03 μm.

This laminate film had the laminate structure as seen in the cross-sectional TEM observation of photograph 1 shown in FIG. 12 and the gradient structure of P as seen in Graph-1 was confirmed by the depth profile analysis of P in the laminate film by AES.

The evaluation results of the plating layer obtained as described above were good and the results are shown in Table 1, Table 2, and Table 3.

The average surface roughness Ra of the glass substrate at the end of the degreasing step was 0.0023 μm and Ra of the glass substrate after removal of this plating film by etching was also the same value.

EXAMPLE 7

The pattern of the laminate film was formed under the same conditions as in Example 4 except that the trade name #7059 available from Corning Corp. was used as the glass substrate.

The evaluation results of the plating layer obtained as described above were good and the results are shown in Table 1, Table 2, and Table 3.

At this time, the average surface roughness Ra of the glass substrate at the end of the degreasing step was 0.0018 μm and Ra of the glass substrate after removal of this plating film by etching was also the same value.

EXAMPLE 8

The glass substrate used herein was H coat glass available from Nippon Sheet Glass, obtained by coating the blue sheet glass with $SiO_2$. The pattern of laminate film was formed under the same conditions as in Example 6 except for the glass substrate.

The evaluation results of the plating layer obtained as described above were good and the results are shown in Table 1, Table 2, and Table 3.

At this time, the average surface roughness Ra of the glass substrate at the end of the degreasing step was 0.0025 μm and Ra of the glass substrate after removal of this plating film by etching was also the same value.

EXAMPLE 9

Deposited on the line pattern formed in the same manner as in Example 6 were Cu 5 μm and Ni 3 μm by electroplating and Au 0.03 μm by displacement plating.

The evaluation results of the plating layer obtained as described above were good and the results are shown in Table 1, Table 2, and Table 3.

At this time, the average surface roughness Ra of the glass substrate at the end of the degreasing step was 0.0022 μm and Ra of the glass substrate after removal of this plating film by etching was also the same value.

EXAMPLE 10

Deposited on the line pattern having the laminate structure of a-Pd/c-Pd formed in the same manner as in Example 6 were Ag 3 μm and Au 1 μm by electroplating.

The evaluation results of the plating layer obtained as described above were good and the results are shown in Table 1, Table 2, and Table 3.

At this time, the average surface roughness Ra of the glass substrate at the end of the degreasing step was 0.0017 μm and Ra of the glass substrate after removal of this plating film by etching was also the same value.

EXAMPLE 11

The same substrate of float blue sheet glass as in Example 1 was subjected to the same pretreatment step and the catalyst nuclei forming step as in Example 1. The electroless palladium plating solution for entire plating of this substrate was trade name APP process available from Ishihara Yakuhin K.K. At this time the glass substrate was plated at the bath temperature 50° C. before the thickness of the a-Pd plating layer became 0.06 μm. The content of P in the a-Pd plating layer deposited in this way was 4 wt %.

Next, the c-Pd plating layer containing 0.07 wt % of P was deposited in the thickness of 0.1 μm on the a-Pd plating layer. The plating solution used for this lamination was the electroless Pd plating solution using ethylene diamine as a complex-forming agent and sodium phosphite as a reducing agent and the plating temperature was 67° C.

The P content in this plating film was 0.08 wt %.

The line pattern was formed using the same photo-etching process as in Example 1 and platinum was further deposited by electroplating.

The platinum electroplating solution was trade name Pt-270 available from N.E. Chemcat and supply of power was continued at pH 6.3 and at the bath temperature 70° C. before the thickness of Pt film became 0.1 μm.

Then the pattern-plated substrate made as described above was subjected to annealing.

The annealing was conducted at the maximum temperature of not more than 180° C. while always blowing fresh air to the surface of substrate in the belt furnace.

The evaluation results of the plating layer obtained as described above were good and the results thereof are shown in Table 1, Table 2, and Table 3.

At this time, the average surface roughness Ra of the glass substrate at the end of the degreasing step was 0.0020 μm. Ra of the glass substrate after removal of this plating film by etching was also the same value.

EXAMPLE 12

Lamination and patterning were carried out under the same conditions as in Example 11 except that the aforementioned electroless palladium plating solution (trade name PARED) available from Kojima Kagaku Yakuhin was used for formation of the c-Pd plating layer.

The evaluation results of the plating layer obtained as described above were good and the results thereof are shown in Table 1, Table 2, and Table 3.

At this time, the average surface roughness Ra of the glass substrate at the end of the degreasing step was 0.0020 μm. Ra of the glass substrate after removal of this plating film by etching was also the same value.

EXAMPLE 13

The pattern of the laminate film was formed under the same conditions as in Example 12 except that the aforementioned product from Corning Corp. (trade name #7059) was used as the glass substrate.

The evaluation results of the plating layer obtained as described above were good and the results thereof are shown in Table 1, Table 2, and Table 3.

At this time, the average surface roughness Ra of the glass substrate at the end of the degreasing step was 0.0018 μm. Ra of the glass substrate after removal of this plating film by etching was also the same value.

EXAMPLE 14

The pattern of laminate film was formed under the same conditions as in Example 12 except that the aforementioned product from Nippon Sheet Glass (trade name H coat glass) was used as the glass substrate.

The evaluation results of the plating layer obtained as described above were good and the results thereof are shown in Table 1, Table 2, and Table 3.

At this time, the average surface roughness Ra of the glass substrate at the end of the degreasing step was 0.0025 μm. Ra of the glass substrate after removal of this plating film by etching was also the same value.

EXAMPLE 15

Deposited on the entire plating of a-Pd formed on the substrate in the same manner as in Example 1 was also the entire layer of Cu electroplating. This laminate film was patterned in the line pattern using the photo-etching process and thereafter Ni was deposited 3 μm by electroplating and Au 0.03 μm by displacement plating.

The evaluation results of the plating layer obtained as described above were good and the results thereof are shown in Table 1, Table 2, and Table 3.

At this time, the average surface roughness Ra of the glass substrate at the end of the degreasing step was 0.0023 μm, and Ra of the glass substrate after removal of this plating film by etching was also the same value.

COMPARATIVE EXAMPLE 1

Figure 8:
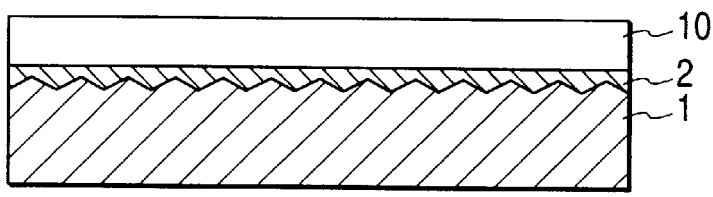
FIG. 8 is a schematic, cross-sectional view of a metallized glass substrate having the layer structure shown in Comparative Example 1 of the present invention.

The same glass substrate as in Example 1 was subjected to the same degreasing process and this substrate was dipped in the hydrofluoric acid solution to rough the surface of glass substrate to the surface roughness Ra of glass substrate of 0.41 μm. This roughed substrate was subjected to the same catalyst nuclei forming process as in Example 1 and electroless Ni—P alloy plating using sodium hypophosphite as a reducing agent was made thereon. Thus, a substrate having the structure shown in FIG. 8 was obtained. In FIG. 8 the numeral 1 denotes the glass substrate, 2 denotes the catalyst nuclei layer and 10 denotes the Ni—P alloy plating layer.

At this time the thickness of the plating film was 0.7 μm and the content of P was 8 wt %.

Then the desired pattern was formed on this substrate by the same photo-etching process as in Example 1.

When this plating layer obtained as described above was subjected to the peeling test by tape, peeling of film occurred within 1% of the test area and the evaluation result thereof was average. After the heat test, peeling of film occurred at many points and the evaluation result was no good. Similarly, disconnection of pattern also occurred at many points in the patterning test and the evaluation result was no good. These evaluation results are shown in Table 1, Table 2, and Table 3.

COMPARATIVE EXAMPLE 2

Figure 9:
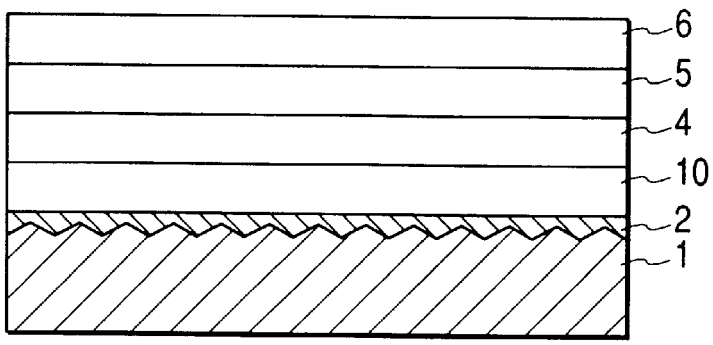
FIG. 9 is a schematic, cross-sectional view of a metallized glass substrate having the layer structure shown in Comparative Example 2 of the present invention.

Deposited on the Ni—P plating pattern formed in Comparative Example 1 were Cu 5 μm, Ni 3 μm, and Au 0.03 μm by electroplating. Thus, a substrate having the structure shown in FIG. 9 was obtained. In FIG. 9, the numeral 4 denotes the Cu layer, 5 denotes the Ni layer and 6 denotes the Au layer.

The plating layer obtained as described above was subjected to the tension test and the average of tensile strength was 0.3 kg/2 mm-by-2 mm square. The evaluation result was no good.

peeled off at the interface between the glass substrate and the Ni—P plating film, so that the evaluation tests described above were not able to be conducted.

It is noted that the above examples showed only some examples of the glass circuit substrate having the plating wiring fabricated according to the present invention and that the present invention is not limited to the above specific examples and can involve a variety of modifications within the technical scope of the present invention, of course.

TABLE 1

Results of tension test

| No | Material of glass substrate | Layer structure of laminate plating layer | a-Pd (or Ni-P) Content of P (wt %) | a-Pd (or Ni-P) Thickness (μm) | c-Pd Content of P (wt %) | c-Pd Thickness (μm) | Surface roughness of glass substrate after completion of pretreatment Ra (μm) | Results of tension test (kg/ 2 mm-by-2 mm square) | Results of tape peeling test |
|---|---|---|---|---|---|---|---|---|---|
| Examples of the invention | | | | | | | | | |
| 1 | A | G/a-Pd | 8 | 0.10 | — | — | 0.0020 | — | Good |
| 2 | B | G/a-Pd | 8 | 0.10 | — | — | 0.0013 | — | Good |
| 3 | C | G/a-Pd | 8 | 0.10 | — | — | 0.0025 | — | Good |
| 4 | A | G/a-Pd/Cu/Ni/Au | 7 | 0.07 | — | — | 0.0020 | 6.5 | — |
| 5 | A | G/a-Pd/Ag/Au | 8 | 0.11 | — | — | 0.0027 | 11.0 | — |
| 6 | A | G/a-Pd/c-Pd | 8 | 0.03 | 0 | 0.03 | 0.0023 | 12.0 | — |
| 7 | B | G/a-Pd/c-Pd | 8 | 0.03 | 0 | 0.03 | 0.0018 | 10.5 | — |
| 8 | C | G/a-Pd/c-Pd | 8 | 0.03 | 0 | 0.03 | 0.0025 | 11.0 | — |
| 9 | A | G/a-Pd/c-Pd/Cu/Ni/Au | 8 | 0.03 | 0 | 0.03 | 0.0022 | 5.0 | — |
| 10 | A | G/a-Pd/c-Pd/Ag/Au | 8 | 0.03 | 0 | 0.03 | 0.0017 | 10.0 | — |
| 11 | A | G/a-Pd/c-Pd/Pt | 4 | 0.06 | 0.07 | 0.10 | 0.0020 | 11.5 | — |
| 12 | A | G/a-Pd/c-Pd/Pt | 8 | 0.05 | 0 | 0.05 | 0.0020 | 11.0 | — |
| 13 | B | G/a-Pd/c-Pd/Pt | 8 | 0.05 | 0 | 0.05 | 0.0018 | 9.5 | — |
| 14 | C | G/a-Pd/c-Pd/Pt | 8 | 0.05 | 0 | 0.05 | 0.0025 | 10.0 | — |
| 15 | A | G/a-Pd/c-Pd/Cu/Ni/Au | 7 | 0.06 | 0.07 | 0.15 | 0.0023 | 5.0 | — |
| Comp. Examples | | | | | | | | | |
| 1 | A | G/Ni-P | 9 | 0.30 | — | — | 0.41 | — | Average |
| 2 | A | G/Ni-P/Cu/Ni/Au | 9 | 0.30 | — | — | 0.41 | 0.3 | — |
| 3 | A | G/Ni-P/Cu/Ni/Au | 9 | 0.01 | — | — | 0.0021 | Pattern peeled | — |

Materials of glass substrate:
A; alkali float glass;
B; Corning #7059
C; alkali glass coated with $SiO_2$
*P contents above are results of analysis in the state of single film.

After the heat test, peeling of film occurred at many points and the evaluation result was no good.

Further, disconnection of pattern also occurred at many points in the patterning test and the evaluation result was no good. These evaluation results are shown in Table 1, Table 2, and Table 3.

COMPARATIVE EXAMPLE 3

The Ni—P plating film of 0.4 μm was deposited under the same conditions as in Comparative Example 1 except that the roughing process of the substrate with hydrofluoric acid was omitted. It was subjected to the same patterning process and Cu electroplating and Ni electroplating layers were stacked in the same manner as in Example 3 in order to obtain the structure shown in FIG. 10. But, the pattern was

TABLE 2

Results of heat test (at 420° C. in oxidizing atmosphere for 15 min.)

| No | Material of glass substrate | Layer structure of laminate plating layer | a-Pd (or Ni-P) Content of P (wt %) | a-Pd (or Ni-P) Thickness (μm) | c-Pd Content of P (wt %) | c-Pd Thickness (μm) | Surface roughness of glass substrate after completion of pretreatment Ra (μm) | Results of heat test |
|---|---|---|---|---|---|---|---|---|
| Examples of the invention | | | | | | | | |
| 1 | A | G/a-Pd | 8 | 0.10 | — | — | 0.0020 | Good |
| 2 | B | G/a-Pd | 8 | 0.10 | — | — | 0.0013 | Good |
| 3 | C | G/a-Pd | 8 | 0.10 | — | — | 0.0025 | Good |
| 4 | A | G/a-Pd/Cu/Ni/Au | 7 | 0.07 | — | — | 0.0020 | Good |
| 5 | A | G/a-Pd/Ag/Au | 8 | 0.11 | — | — | 0.0027 | Good |
| 6 | A | G/a-Pd/c-Pd | 8 | 0.03 | 0 | 0.03 | 0.0023 | Good |
| 7 | B | G/a-Pd/c-Pd | 8 | 0.03 | 0 | 0.03 | 0.0018 | Good |
| 8 | C | G/a-Pd/c-Pd | 8 | 0.03 | 0 | 0.03 | 0.0025 | Good |
| 9 | A | G/a-Pd/c-Pd/Cu/Ni/Au | 8 | 0.03 | 0 | 0.03 | 0.0022 | Good |
| 10 | A | G/a-Pd/c-Pd/Ag/Au | 8 | 0.03 | 0 | 0.03 | 0.0017 | Good |
| 11 | A | G/a-Pd/c-Pd/Pt | 4 | 0.06 | 0.07 | 0.10 | 0.0020 | Good |
| 12 | A | G/a-Pd/c-Pd/Pt | 8 | 0.05 | 0 | 0.05 | 0.0020 | Good |
| 13 | B | G/a-Pd/c-Pd/Pt | 8 | 0.05 | 0 | 0.05 | 0.0018 | Good |
| 14 | C | G/a-Pd/c-Pd/Pt | 8 | 0.05 | 0 | 0.05 | 0.0025 | Good |
| 15 | A | G/a-Pd/c-Pd/Cu/Ni/Au | 7 | 0.06 | 0.07 | 0.15 | 0.0023 | Good |
| Comp. Examples | | | | | | | | |
| 1 | A | G/Ni-P | 9 | 0.30 | — | — | 0.41 | No good |
| 2 | A | G/Ni-P/Cu/Ni/Au | 9 | 0.30 | — | — | 0.41 | No good |
| 3 | A | G/Ni-P/Cu/Ni/Au | 9 | 0.01 | — | — | 0.0021 | Pattern peeled |

Materials of glass substrate:
A; alkali float glass
B; Corning #7059
C; alkali glass coated with $SiO_2$
*P contents above are results of analysis in the state of single film.

TABLE 3

Results of patterning test

| No | Material of glass substrate | Layer structure of laminate plating layer | a-Pd (or Ni-P) Content of P (wt %) | a-Pd (or Ni-P) Thickness (μm) | Surface roughness of glass substrate after completion of pretreatment Ra (μm) | Number of disconnected lines (among 50 measured lines) line width 50 (μm) | line width 100 (μm) | line width 200 (μm) | Evaluation results |
|---|---|---|---|---|---|---|---|---|---|
| Examples of the invention | | | | | | | | | |
| 1 | A | G/a-Pd | 8 | 0.10 | 0.0020 | 0 | 0 | 0 | Good |
| 2 | B | G/a-Pd | 8 | 0.10 | 0.0013 | 0 | 0 | 0 | Good |
| 3 | C | G/a-Pd | 8 | 0.10 | 0.0025 | 0 | 0 | 0 | Good |
| 4 | A | G/a-Pd/Cu/Ni/Au | 7 | 0.07 | 0.0020 | 0 | 0 | 0 | Good |
| 5 | A | G/a-Pd/Ag/Au | 8 | 0.11 | 0.0027 | 0 | 0 | 0 | Good |
| 6 | A | G/a-Pd/c-Pd | 8 | 0.03 | 0.0023 | 0 | 0 | 0 | Good |
| 7 | B | G/a-Pd/c-Pd | 8 | 0.03 | 0.0018 | 0 | 0 | 0 | Good |
| 8 | C | G/a-Pd/c-Pd | 8 | 0.03 | 0.0025 | 0 | 0 | 0 | Good |
| 9 | A | G/a-Pd/c-Pd/Cu/Ni/Au | 8 | 0.03 | 0.0022 | 0 | 0 | 0 | Good |
| 10 | A | G/a-Pd/c-Pd/Ag/Au | 8 | 0.03 | 0.0017 | 0 | 0 | 0 | Good |
| 11 | A | G/a-Pd/c-Pd/Pt | 4 | 0.06 | 0.0020 | 0 | 0 | 0 | Good |
| 12 | A | G/a-Pd/c-Pd/Pt | 8 | 0.05 | 0.0020 | 0 | 0 | 0 | Good |
| 13 | B | G/a-Pd/c-Pd/Pt | 8 | 0.05 | 0.0018 | 0 | 0 | 0 | Good |
| 14 | C | G/a-Pd/c-Pd/Pt | 8 | 0.05 | 0.0025 | 0 | 0 | 0 | Good |

TABLE 3-continued

Results of patterning test

| No | Material of glass substrate | Layer structure of laminate plating layer | a-Pd (or Ni-P) Content of P (wt %) | Thickness ($\mu$m) | Surface roughness of glass substrate after completion of pretreatment Ra ($\mu$m) | Number of disconnected lines (among 50 measured lines) line width 50 ($\mu$m) | line width 100 ($\mu$m) | line width 200 ($\mu$m) | Evaluation results |
|---|---|---|---|---|---|---|---|---|---|
| 15 | A | G/a-Pd/c-Pd/Cu/Ni/Au | 7 | 0.06 | 0.0023 | 0 | 0 | 0 | Good |
| Comp. Examples | | | | | | | | | |
| 1 | A | G/Ni-P | 9 | 0.30 | 0.41 | 18 | 10 | 1 | No good |
| 2 | A | G/Ni-P/Cu/Ni/Au | 9 | 0.30 | 0.41 | 25 | 13 | 2 | No good |
| 3 | A | G/Ni-P/Cu/Ni/Au | 9 | 0.01 | 0.0021 | — | — | — | Pattern peeled |

Materials of glass substrate:
A; alkali float glass
B; Corning #7059
C; alkali glass coated with $SiO_2$
*P Contents above are results of analysis in the state of single film.

EXAMPLE 16
(Glass substrate/PdP/Ag)

Figure 18:
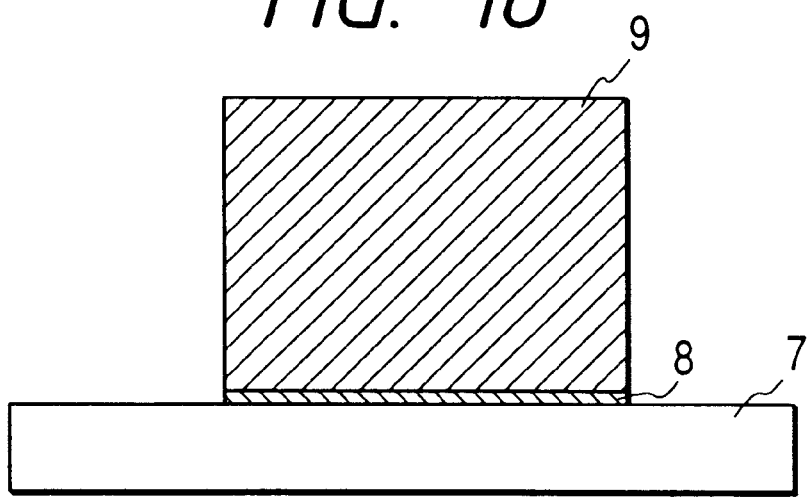
FIG. 18 is a schematic, cross-sectional view for explaining a glass wiring substrate according to the present invention.

FIG. 18 is a schematic, cross-sectional view for explaining a glass wiring substrate according to the present invention. In FIG. 18, numeral 7 designates the glass substrate, 8 the electroless plating PdP film, and 9 the electroplating Ag film.

First, the surface of float glass (blue sheet glass available from Nippon Sheet Glass) as the substrate was cleaned under ultrasonic wave with a water-soluble degreasing agent, thereafter cleaned with a strong acid (sulfuric acid+ chromium oxide solution), then cleaned with a strong alkali (10 N sodium hydroxide solution), and then washed with pure water. Subsequently, the catalyst nuclei of Pd were made by the ordinary sensitizer activator method (the method for substituting Sn adsorbing to the surface of substrate for Pd). Specifically, the substrate was dipped in an aqueous solution of pH 1 and the bath temperature 25° C. containing 0.06 g/l of stannous chloride for three minutes, washed with pure water, then dipped at 25° C. in an aqueous solution containing 0.1 g/l of palladium chloride for five minutes, and washed with pure water, thereby making the catalyst nuclei of Pd on the glass substrate.

The other effective catalyst nuclei forming methods than the sensitizer activator method include the catalyst accelerator method for making the Sn—Pd colloid adsorb to the surface of glass substrate, the alkali catalyst method for making an alkaline Pd complex adsorb to the surface of substrate and thereafter reducing it to precipitate metal Pd, and so on.

Then the Pd—P film 8 was formed in the thickness of 0.3 $\mu$m on the glass substrate with the above Pd catalyst nuclei formed thereon, by electroless plating using the Pd—P electroless plating solution and the bath temperature of 55° C. Then the electronic circuit pattern was formed on the Pd—P film 8 by the photolithography using a positive resist and unnecessary portions were removed by chemical etching with a mixed acid (a mixed solution of nitric acid, hydrochloric acid, and acetic acid). Subsequently, the Ag film 9 was formed by electroplating on the pattern of PdP film 8 on the non-roughed glass substrate 7 having the above electronic circuit pattern. The Ag plating was carried out with a low cyanogen type quick Ag plating solution in 20 A/dm² for two minutes to form the Ag film 9 in the thickness of 2 $\mu$m.

The glass wiring substrate obtained as described above was subjected to the tape peeling test and no peeling of wiring was confirmed. The volume resistivity of this wiring was $1.7 \times 10^{-6}$ $\Omega$cm and wiring adhesive strength was good, not less than 2.5 kgf/2 mm-by-2 mm square.

EXAMPLE 17
(Glass substrate/PdP/Ag)

The present example will be described referring to FIG. 18.

In FIG. 18, numeral 7 denotes the glass substrate, 8 the electroless plating PdP film, and 9 the electroplating Ag film.

First, the surface of float glass (blue sheet glass available from Nippon Sheet Glass) as the substrate was cleaned well, thereafter nuclei of Pd were made by the sensitizer activator method, and then the Pd—P film 8 was made in the thickness of 0.1 $\mu$m by electroless plating. Then the electronic circuit pattern was made on the Pd—P film 8 by the photolithography using the positive resist and unnecessary portions of the Pd—P film 8 were removed by chemical etching with the mixed acid (the mixed solution of nitric acid, hydrochloric acid, and acetic acid). Subsequently, the resist was removed and the Ag film 9 was formed by electroplating on the electronic circuit pattern PdP film 8 on the non-roughed glass substrate 7. The Ag plating was continued with the low cyanogen type quick Ag plating solution in 20 A/dm² for two minutes to form the electronic circuit pattern Ag film 9 in the thickness of 2 $\mu$m. This formed the metal wiring pattern comprised of the lamination of PdP film 8 and Ag film 9. After this, the heat treatment was conducted at 450° C. for 30 minutes, thereby advancing the mutual diffusion between the glass substrate and the metal wiring.

Figure 20:
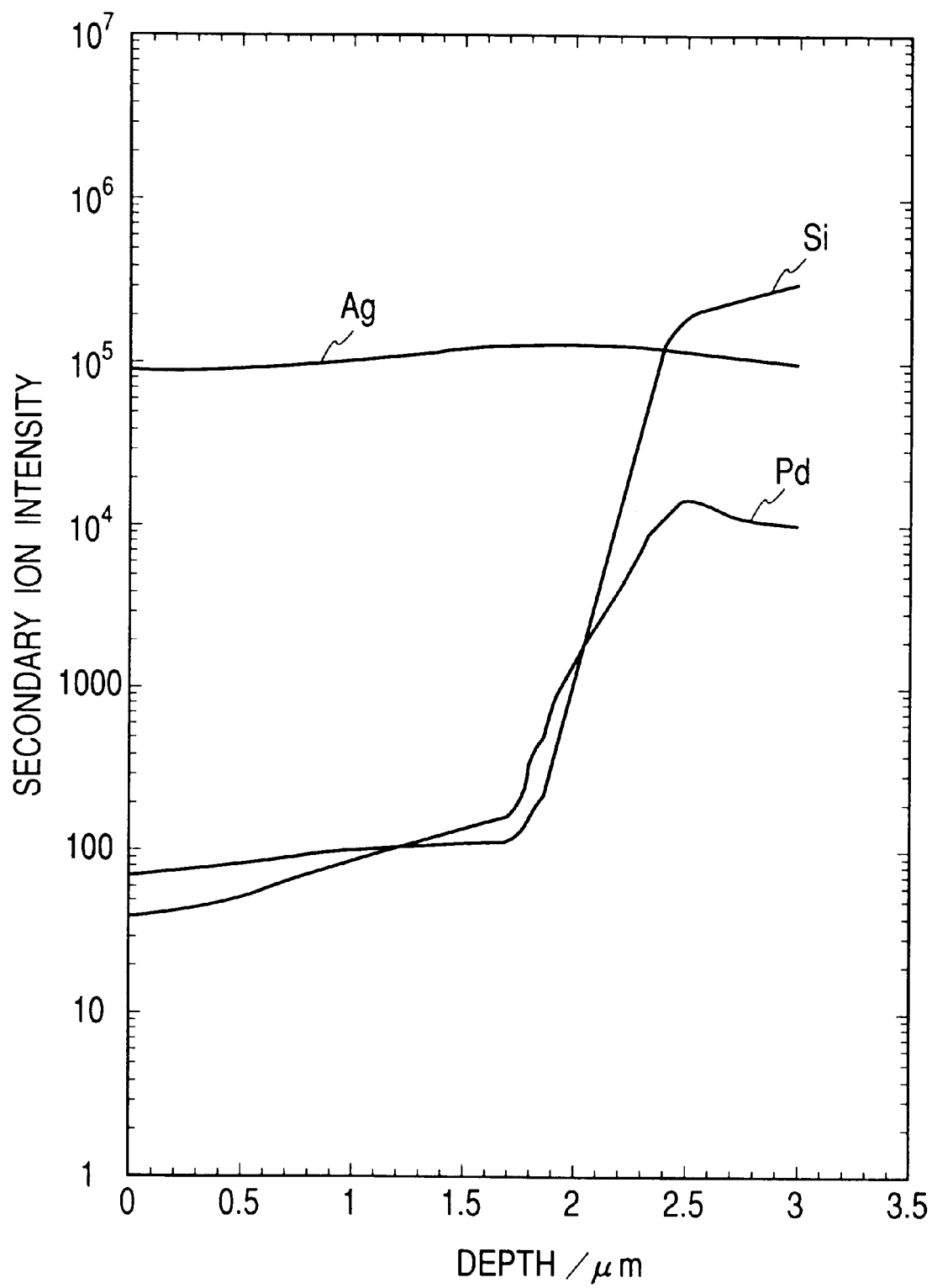
FIG. 20 is a drawing to show results of depthwise analysis by SIMS after the heat treatment.

FIG. 19 shows results of analysis in the depthwise direction by SIMS before the above heat treatment and FIG. 20 results of analysis in the depthwise direction by SIMS after the above heat treatment. As apparent from FIG. 19 and FIG. 20, the heat treatment induced the mutual diffusion of the component (Si) of the glass substrate and the components (Pd, Ag) of the metal wiring. For example, Pd, Si in FIG. 19 show sudden changes near the interface, but in FIG. 20 slopes of profiles of Pd and Si become gentler and Ag is apparently in the glass. The thickness of the mutual diffusion layer at this time was about 500 nm.

The glass wiring substrate obtained as described above was subjected to the tape peeling test and no peeling of wiring was confirmed. The volume resistivities of this wiring were $1.7 \times 10^{-6}$ Ωcm before heating and $2.3 \times 10^{-6}$ Ωcm after heating (in the case of the aforementioned conventional Ag printed wiring substrate, the volume resistivity was $6 \times 10^{-6}$ Ωcm). The wiring adhesive strength was good, not less than 2.5 kgf/2 mm-by-2 mm square.

EXAMPLE 18
(Glass substrate/PdP/Ag/Au)

Figure 21:
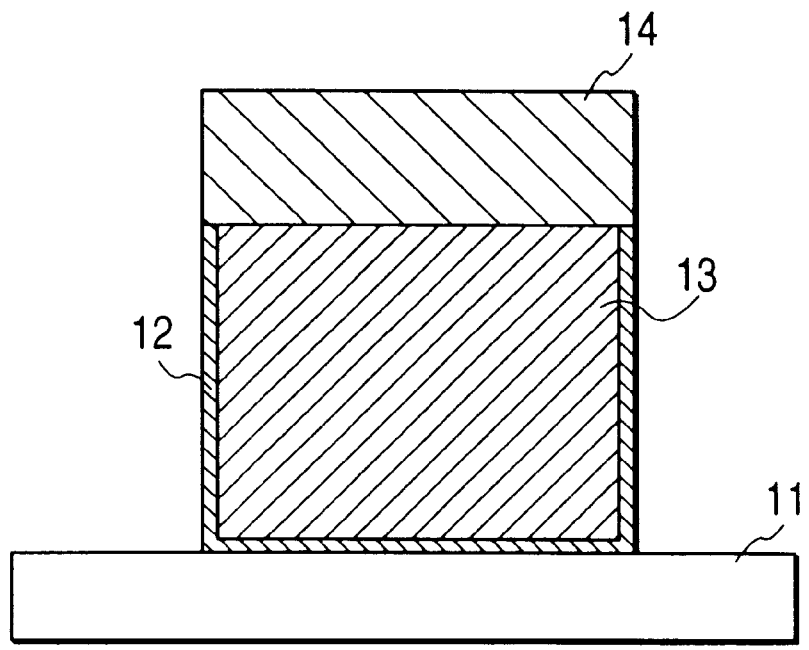
FIG. 21 is a schematic, cross-sectional view for explaining a glass wiring substrate according to the present invention.

FIG. 21 is a schematic, cross-sectional view for explaining the glass wiring substrate according to the present invention. In FIG. 21, numeral 11 designates the glass substrate, 12 the electroless plating PdP film, 13 the electroplating Ag film, and 14 an electroplating Au film.

First, the surface of float glass (blue sheet glass available from Nippon Sheet Glass) as the substrate was cleaned well, thereafter nuclei of Pd were made by the sensitizer activator method, and then the Pd—P film 12 was made in the thickness of 0.1 $\mu$m by electroless plating. Then the electronic circuit pattern was made on the Pd—P film 12 by the photolithography using the positive resist and unnecessary portions of the Pd—P film 12 were removed by chemical etching with the mixed acid (the mixed solution of nitric acid, hydrochloric acid, and acetic acid). Subsequently, the resist was removed and the Ag film 13 was formed by electroplating on the electronic circuit pattern PdP film 12 on the non-roughed glass substrate 11. The Ag plating was continued with the low cyanogen type quick Ag plating solution in 20 A/dm² for two minutes to form the electronic circuit pattern Ag film 13 in the thickness of 2 $\mu$m. Then the electronic circuit pattern Au film 14 was formed in the thickness of 1 $\mu$m by plating with a low cyanogen type Au plating solution in 10 A/dm² for two minutes. The Au film 14 was also formed on the side faces of the Ag film 13, thereby obtaining the structure wherein the Ag film 13 was covered by the Au film 14 and thus obtaining the metal wiring pattern comprised of the lamination of PdP film 12, Ag film 13, and Au film 14. After this, the heat treatment was conducted at 450° C. for 30 minutes, thereby advancing the mutual diffusion between the glass substrate and the metal wiring.

Figure 22:
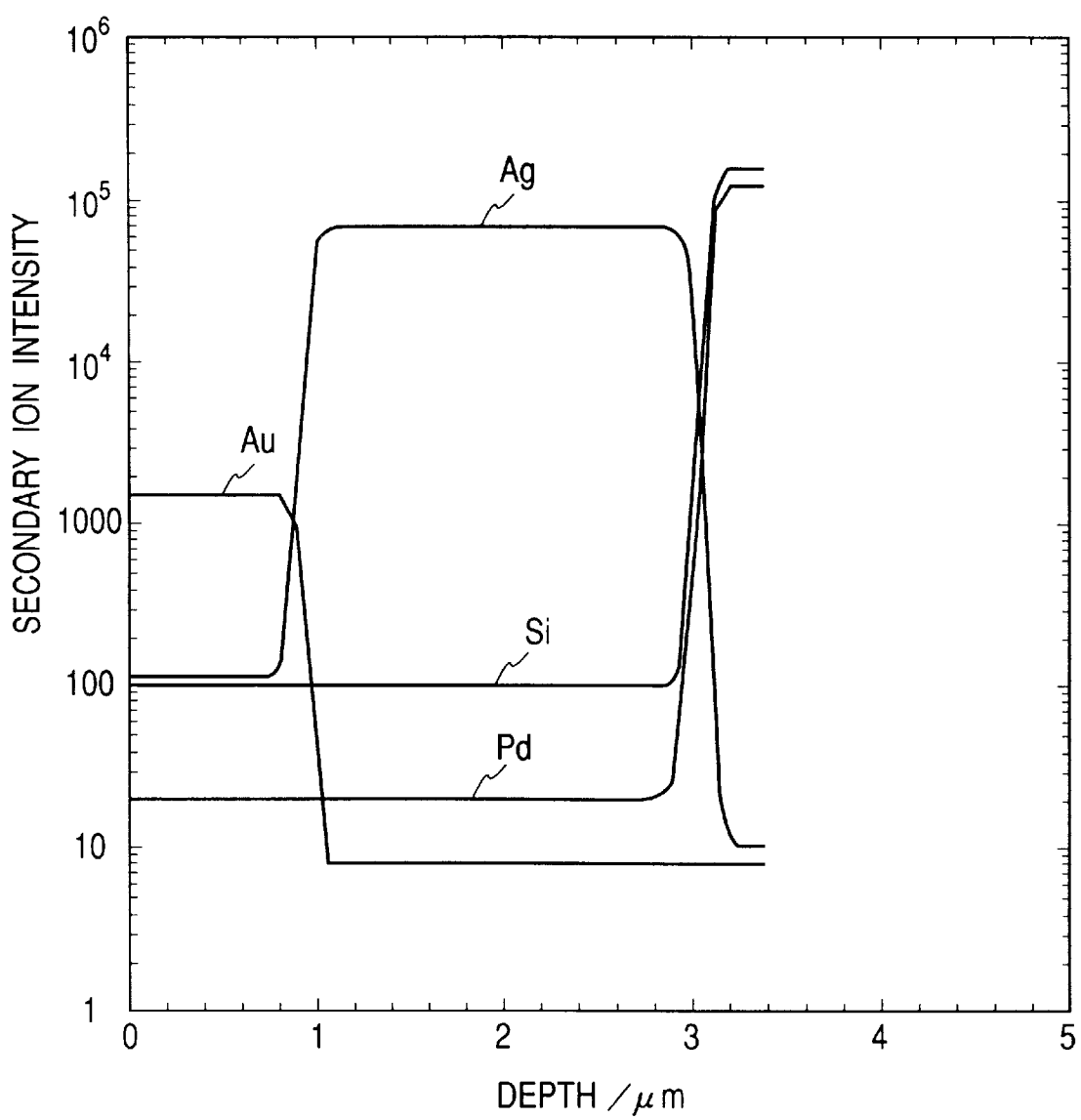
FIG. 22 is a drawing to show results of depthwise analysis by SIMS before the heat treatment.
Figure 23:
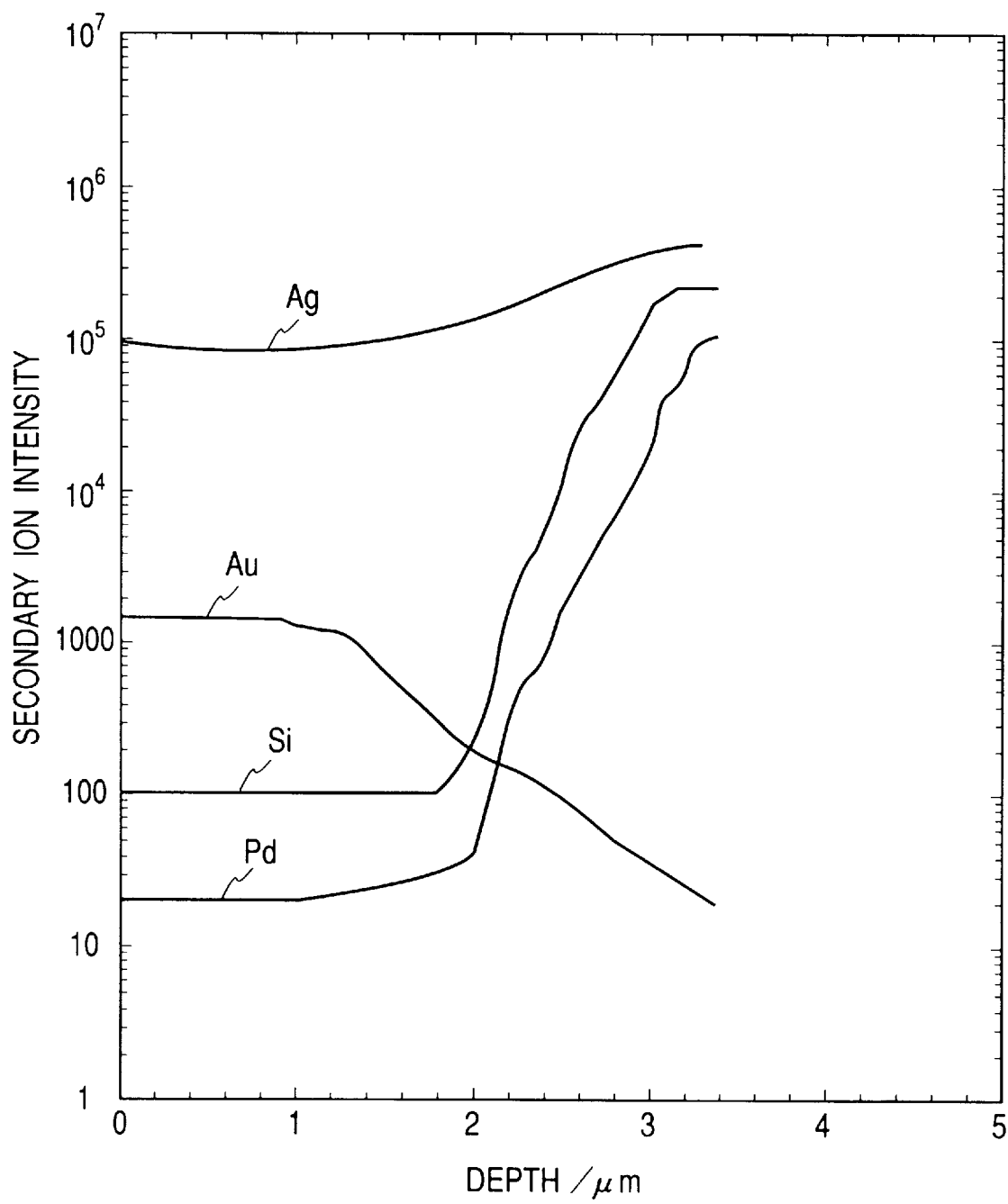
FIG. 23 is a drawing to show results of depthwise analysis by SIMS after the heat treatment.

FIG. 22 shows results of analysis in the depthwise direction by SIMS before the above heat treatment and FIG. 23 results of analysis in the depthwise direction by SIMS after the above heat treatment. As apparent from FIG. 22 and FIG. 23, the heat treatment induced the mutual diffusion of the component (Si) of the glass substrate and the components (Pd, Ag, Au) of the metal wiring. For example, Pd, Si in FIG. 22 show sudden changes near the interface, but in FIG. 23 slopes of profiles of Pd and Si become gentler, Ag is apparently in the glass, and Au is also in the glass though less than Ag. The thickness of the mutual diffusion layer at this time was about 1000 nm.

The glass wiring substrate obtained as described above was subjected to the tape peeling test and no peeling of wiring was confirmed. The volume resistivities of this wiring were $1.7 \times 10^{-6}$ Ωcm before heating and $2.3 \times 10^{-6}$ Ωcm after heating. The wiring adhesive strength was good, not less than 2.5 kgf/2 mm-by-2 mm square.

EXAMPLE 19
(Glass substrate/Pd—P/Ag wiring)

Example 19 of the present invention will be described. The flow shown in FIGS. 26A to 26F is employed to carry out the fabrication method of the glass wiring substrate. In this example electroless Pd—P plating is adopted as the electroless plating. First, the surface of borosilicate glass (1737 available from Corning Corp.), being the non-roughed glass substrate, was cleaned with a strong acid and a strong alkali. After that, nuclei of Pd were made by the alkali catalyst method and on the basis thereof the electroless Pd—P plating was made in the thickness of approximately 0.1 $\mu$m.

Then a film of a negative resist (OMR-85 available from Tokyo Ohka Kogyo) was formed in the thickness of 2 $\mu$m on the electroless Pd—P plating film. Then the circuit pattern was made by photolithography on the electroless Pd—P plating film so as to make holes in portions where the wiring and electrodes were desired to be made. At this time the electroless Pd—P plating film was exposed in the hole portions of resist. In this state the surface of the electroless Pd—P plating film was cleaned and activated for electroplating with OPC clean 91 (available from Okuno Seiyaku).

Figure 28:
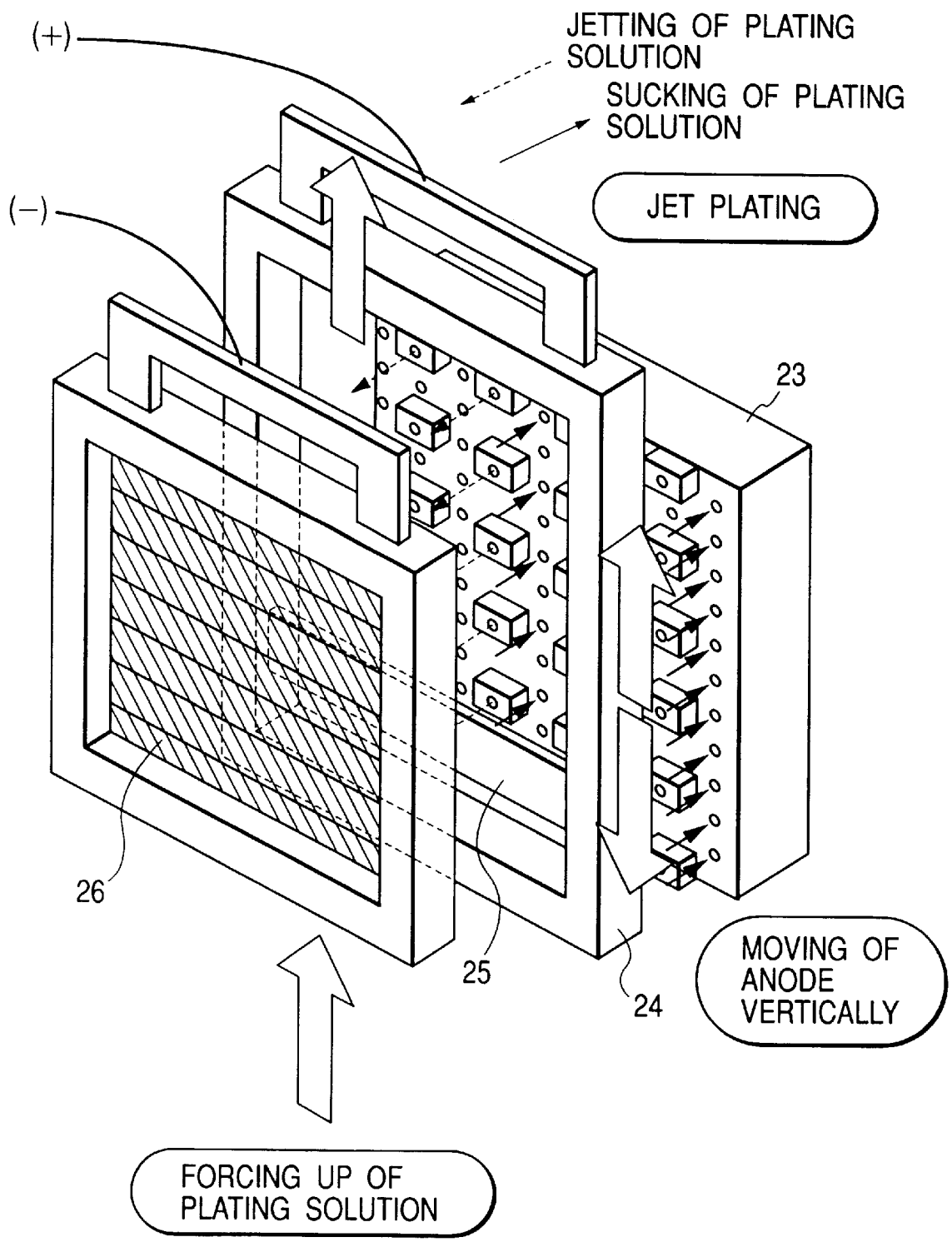
FIG. 28 is a conceptual drawing of a jet plating device associated with the present invention.

Subsequently, silver electroplating was effected in the jet plating device shown in the conceptual drawing of FIG. 28. In the drawing numeral 23 designates a plating solution jet flow cell, 24 a movable anode, 25 a Pt-coated Ti anode electrode, and 26 a patterned glass substrate. The plating device used in the present invention was so arranged that the unit shown in FIG. 28 was installed in the plating solution, the movable anode 24 was moved translationally (vertically) with respect to the patterned glass substrate vertically fixed in the plating solution, and during the translational movement of the movable electrode 24 the plating solution was ejected from the plating solution jet flow cell 23 onto the glass substrate 26.

Figure 29:
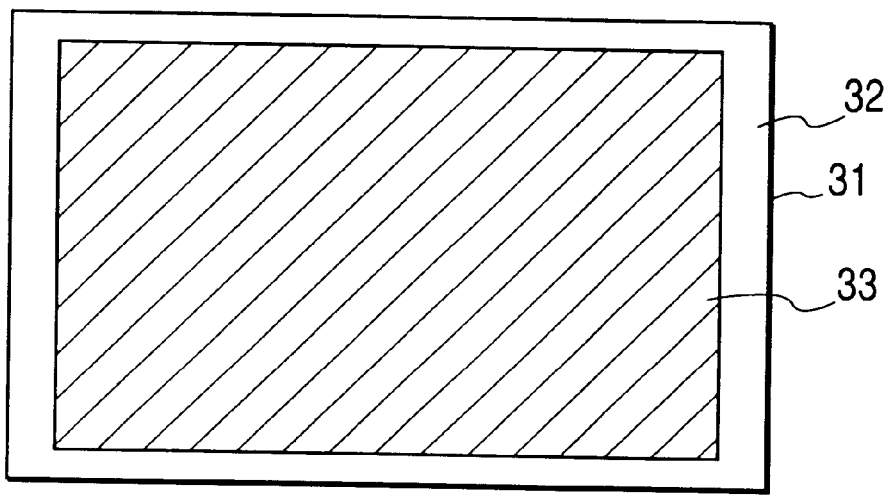
FIG. 29 is a conceptual drawing for explanation with a substrate by the electroplating method associated with the present invention.
Figure 30:
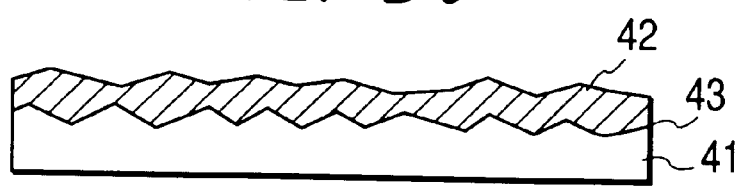
FIG. 30 is a schematic, cross-sectional view to show a state in which an electroless plating film is formed on a conventional roughed substrate.
Figure 31:
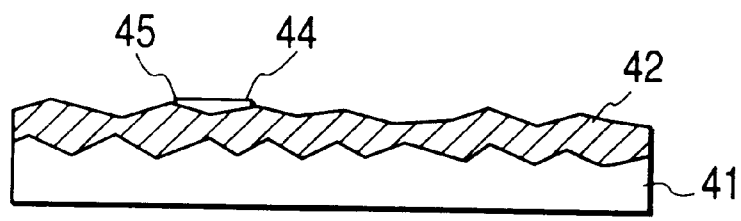
FIG. 31 is a schematic, cross-sectional view of a substrate in which an electrode is provided on a surface of the electroless plating film.

This method is an improvement in the method adopted for the through-hole plating on the conventional printed wiring substrate, but, particularly, the present method employs a method for always circulating the plating solution while forcing the plating solution upward from bottom to top of the glass substrate. For realizing a plating film of more uniform film quality and film thickness at this time, the present invention can propose the following plating process. Namely, as shown in FIG. 29, the glass substrate obtained by the electroplating method according to the present invention has such structure that electroless plating film 32 is exposed on the frame of non-roughed glass 31 to be used as a power supply portion and numeral 33 is the negative resist portion.

The wiring pattern (not illustrated) is formed in this negative resist portion 33. In practical plating the plating is also attached to this power supplying portion to decrease the resistance of the frame portion, so that the power can be supplied more uniformly as a whole of the glass substrate. The resistance of the electroless Pd plating film used herein is 1×10E-4 Ωcm. Unless the technique of the present invention is used, a difference of ten times will appear in the film thickness distribution between the central portion and the peripheral portion.

When the method for driving the anode electrode is employed as this time, the voltage varies upon the drive of anode in a constant current state, for example. Therefore, current-voltage control was performed so as to preliminarily cancel it, thereby achieving more uniform plating. As a result, the difference in thickness between the central portion of glass substrate and the periphery of substrate was able to be controlled within ±20%. The silver plating solution used was a low cyanogen type quick silver plating solution and the Ag plating wiring 2 $\mu$m thick was formed by plating in 20 A/dm² and for two minutes.

Figure 27:
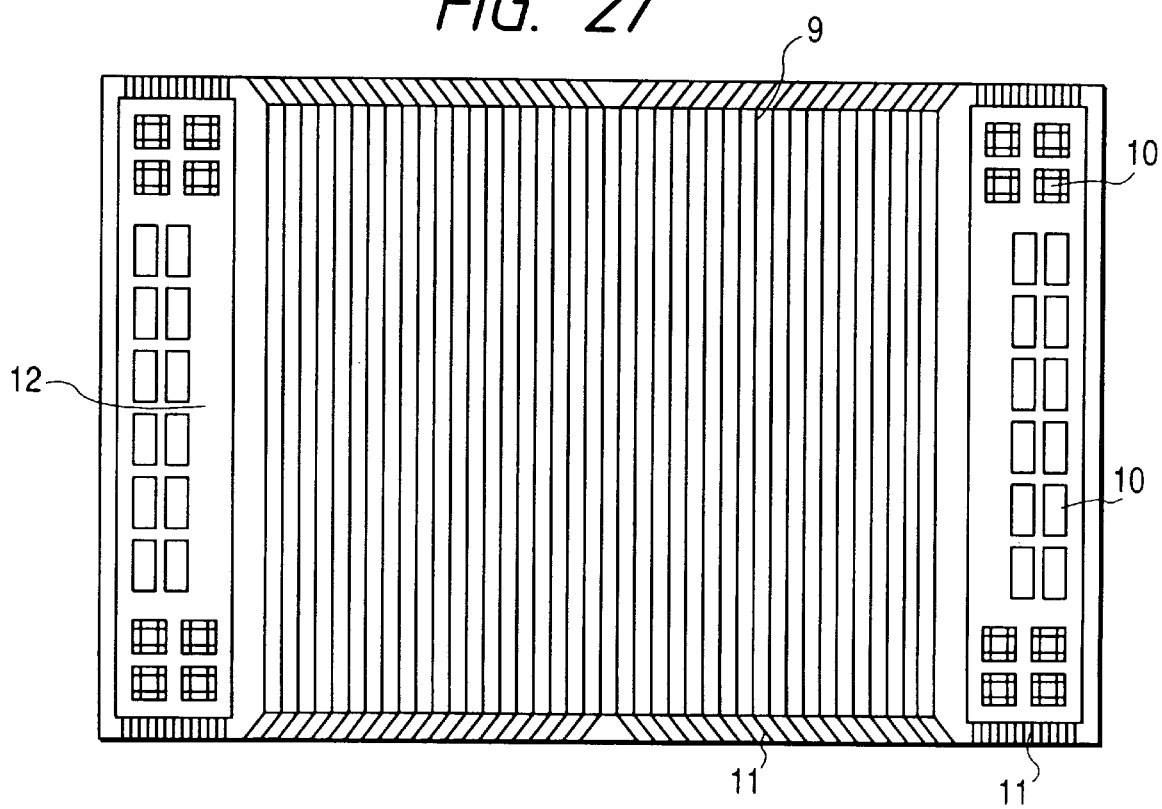
FIG. 27 is a plan view to show a glass wiring substrate obtained by mounting wiring for display and electronic parts on one substrate.

Next, the resist residue was decomposed by UV (ultraviolet) irradiation, for peeling the resist. After that, unnecessary portions were removed by chemical etching with the mixed acid (the mixed solution of nitric acid, hydrochloric acid, and acetic acid), obtaining the electronic circuit pattern as shown in FIG. 27. Then bumps were bonded to this glass substrate with an electroconductive adhesive and electronic parts were mounted. The basic characteristics were checked and good results were obtained.

EXAMPLE 20
(Glass substrate/Ni—P/Ag wiring)

In this example the portion of the electroless Pd—P plating film being the undercoat layer in Example 19 was replaced by an electroless nickel-phosphorus film (Ni—P) being a cheaper material. It was fabricated by the same technique as in Example 19 and the electroplating was also conducted in similar fashion to Example 19 to form the silver plating. As a result, adhesion between the glass substrate and the wiring was also good in this example and the wiring substrate had sufficient performance.

Examples 19 and 20 showed that the electroless plating was made on the glass substrate the plated surface of which was in the non-roughed state, thereafter the lower wiring configuration was made of the laminate plating by patterning, and the wiring was made thereon by plating, whereby the wiring for display of image and the electric elements such as IC were formed in fit on the same substrate.

The following effects are achieved in this case.

(1) The resistance can be made lower than that of the baked wiring of printed paste.

(2) The electrode configuration can be formed with accuracy, because the wiring is made on the non-roughed glass.

(3) Since the wiring can be formed without use of a baking furnace or a vacuum deposition system, the throughput (mass productivity) can be increased.

(4) The space can be saved, because direct mounting can be done on the display wiring substrate.

What is claimed is:

1. A glass circuit substrate comprising:
   (a) a layer of palladium (Pd) nuclei on a glass substrate;
   (b) a plating layer of palladium—phosphorous (Pd—P) on the layer of palladium nuclei, wherein a thickness of said Pd—P plating layer is from 0.015 µm to 0.500 µm.

2. A glass circuit substrate comprising:
   (a) a layer of palladium (Pd) nuclei on a glass substrate;
   (b) a plating layer of palladium-phosphorous (Pd—P) on the layer of palladium nuclei, wherein a content of phosphorus of said Pd—P plating layer is from 3.0 (wt %) to 10.0 (wt %).

3. A glass circuit substrate comprising:
   (a) a layer of palladium (Pd) nuclei on a glass substrate;
   (b) a plating layer of palladium-phosphorous (Pd—P) on the layer of palladium nuclei, wherein a second plating layer comprised of at least one material selected from the group consisting of Cu, Ni, Ni-P, Ag, Pd, Pd—P, Au and Pt is disposed on said Pd—P plating layer.

4. A glass circuit substrate comprising:
   (a) a layer of palladium (Pd) nuclei on a glass substrate;
   (b) a plating layer of palladium-phosphorous (Pd—P) on the layer of palladium nuclei, further comprising a Cu plating layer, an Ni plating layer, and an Au plating layer on said Pd—P plating layer.

5. A glass circuit substrate comprising:
   (a) a layer of palladium (Pd) nuclei on a glass subsrate;
   (b) a plating layer of palladium-phosphorous (Pd—P) on the layer of palladium nuclei, further comprising an Ag plating layer and an Au plating layer on said Pd—P plating layer.

6. A glass circuit substrate comprising:
   (a) a layer of palladium (Pd) nuclei on a glass substrate;
   (b) a plating layer of palladium-phosphorous (Pd—P) on the layer of palladium nuclei, said Pd—P plating layer having a thickness of from 0.015 µm to 0.500 µm and a phosphorous content of from 3.0 (wt%) to 10.0 (wt%); and
   (c) a second plating layer comprised of at least one material selected from the group consisting of Cu, Ni, Ni-P, Ag, Pd, Pd—P, Au, and Pt disposed on said Pd—P plating layer.

7. A glass circuit substrate comprising:
   (a) a layer of palladium (Pd) nuclei on a glass substrate;
   (b) a plating layer of palladium-phosphorous (Pd—P) on the layer of palladium nuclei; and
   (c) another Pd—P plating layer on said Pd—P plating layer, wherein said Pd—P plating layer on the layer of palladium nuclei is in an amorphous state and said another Pd—P plating layer is in a crystalline state.

8. A glass circuit substrate comprising:
   (a) a layer of palladium (Pd) nuclei on a glass substrate;
   (b) a plating layer of palladium-phosphorous (Pd—P) on the layer of palladium nuclei, wherein
   (c) said glass substrate is a non-roughed glass substrate and said Pd—P plating layer is an electroless plating layer; and
   (d) a metal plating film is placed on said Pd—P plating layer.

9. A glass circuit substrate according to claim 7, comprising a Cu plating layer, an Ni plating layer, and an Au plating layer on said crystalline Pd—P plating layer.

10. A glass circuit substrate according to claim 7, comprising an Ag plating layer and an Au plating layer on said crystalline Pd—P plating layer.

11. A glass circuit substrate according to claim 7, comprising a Pt plating layer on said crystalline Pd—P plating layer.

12. A glass circuit substrate according to claim 7, wherein a thickness of said crystalline Pd—P layer is from 0.015 µm to 0.250 µm.

13. A glass circuit substrate according to claim 7, wherein crystallinity varies on a gradient basis at an interface between said amorphous Pd—P plating layer and said crystalline Pd—P layer.

14. A glass circuit substrate according to claim 13, having such a film structure that the P content decreases so as to be continuously gradient from said amorphous Pd—P plating layer into said crystalline Pd—P plating layer.

15. A glass circuit substrate according to claim 7, wherein a thickness of said crystalline Pd—P plating layer is from 0.015 µm to 0.25 µm.

16. A glass circuit substrate according to claim 7, wherein a content of phosphorus of said crystalline Pd—P plating layer is from 0 to 1 (wt %).

17. A glass circuit substrate according to claim 8, wherein a thickness of said Pd—P film is 02. µm or more.

18. A glass circuit substrate according to claim 17, wherein the thickness of said Pd—P layer is 0.5 µm or less.

19. A glass circuit substrate according to claim 8, wherein said metal is at least one of Ag and Au.

20. A glass circuit substrate according to claim 8, comprising a mutual diffusion layer of a glass component forming said glass substrate, said Pd—P, and said metal.

21. A glass circuit substrate according to claim 8, wherein said metal film is comprised of a laminate film of a stack of plural metal layers.

22. A glass circuit substrate according to claim 20, wherein an alloy of said Pd—P and said metal is formed in said mutual diffusion layer.

23. A glass circuit substrate according to claim 20, wherein a thickness of said mutual diffusion layer is from 200 nm to 2000 nm.

24. A glass circuit substrate according to claim 8, wherein said Pd—P film comprises a pattern and said metal film also comprises a similar pattern thereto.

25. A glass circuit substrate according to claim 22, wherein an electric element is connected to said metal film.

26. A glass circuit substrate according to claim 25, wherein said electric element is selected from a wire for display of image and an IC.

27. A method for fabricating a glass circuit substrate comprising steps of:

forming nuclei of Pd (palladium) on a glass substrate; and thereafter forming a plating layer of Pd—P (palladium-phosphorus) on said nuclei, said Pd—P plating layer having a thickness of from 0.015 $\mu$m to 0.500 $\mu$m.

28. A method for fabricating a glass circuit substrate comprising steps of:

forming nuclei of Pd (palladium) on a glass substrate; and thereafter forming a plating layer of Pd—P (palladium-phosphorous) on said nuclei, said Pd—P plating layer having a phosphorous content of from 3.0 (wt %) to 10.0 (wt %).

29. A method for fabricating a glass circuit substrate comprising steps of:

forming nuclei of Pd (palladium) on a glass substrate; and forming a first plating layer of Pd—P (palladium-phosphorous) on said nuclei; and forming a second plating layer on said first plating layer;

wherein said second plating layer is comprised of a metal or an alloy of two or more selected from the group consisting of Cu, Ni, Ni—P, Ag, Pd, Pd—P, Au, and Pt.

30. A method for fabricating a glass circuit substrate comprising steps of:

forming nuclei of Pd (palladium) on a glass substrate; and thereafter forming a plating layer of Pd—P (palladium-phosphorus) on said nuclei, said Pd—P plating layer having a thickness of from 0.015 $\mu$m to 0.500 $\mu$m and a phosphorous content of from 3.0 (wt%) to 10.0 (wt %).

31. A method for fabricating a glass circuit substrate comprising steps of:

forming nuclei of Pd (palladium) on a glass substrate;

thereafter forming a plating layer of Pd—P (palladium-phosphorus) on said nuclei; and providing a Cu plating layer, a Ni plating layer, a Au plating layer, a Ag and a Au plating layer, and another Pt plating layer on said Pd—P plating layer.

32. A method for fabricating a glass circuit substrate comprising steps of:

forming nuclei of Pd (palladium) on a glass substrate, wherein said glass substrate is a non-roughed glass substrate;

thereafter forming a plating layer of Pd—P (palladium-phosphorus) on said nuclei wherein said Pd—P plating layer is an electroless plating layer; and placing a metal plating film on said Pd—P plating layer.

33. A method for fabricating a glass circuit substrate according to claim 30, comprising a step of providing a Cu plating layer, an Ni plating layer, and an Au plating layer on said Pd—P plating layer.

34. A method for fabricating a glass circuit substrate according to claim 30, comprising a step of providing an Ag plating layer and an Au plating layer on said Pd—P plating layer.

35. A method for fabricating a glass circuit substrate according to claim 30, further comprising a step of providing another Pd—P plating layer on said Pd—P plating layer.

36. A method for fabricating a glass circuit substrate according to claim 35, wherein said Pd—P plating layer placed on said nuclei is in an amorphous state and said another Pd—P plating layer placed on the amorphous Pd—P plating layer is in a crystalline state.

37. A method for fabricating a glass circuit substrate according to claim 36, comprising a step of providing a Cu plating layer, an Ni plating layer, and an Au plating layer on said crystalline Pd—P plating layer.

38. A method for fabricating a glass circuit substrate according to claim 36, comprising a step of providing an Ag plating layer and an Au plating layer on said crystalline Pd—P plating layer.

39. A method for fabricating a glass circuit substrate according to claim 36, comprising a step of providing a Pt plating layer on said crystalline Pd—P plating layer.

40. A method for fabricating a glass circuit substrate according to claim 36, wherein a thickness of said crystalline Pd—P layer is from 0.015 $\mu$m to 0.250 $\mu$m.

41. A method for fabricating a glass circuit substrate according to claim 32, wherein a thickness of said Pd—P film is 0.2 $\mu$m or more.

42. A method for fabricating a glass circuit substrate according to claim 41, wherein the thickness of said Pd—P film is 0.5 $\mu$m or less.

43. A method for fabricating a glass circuit substrate according to claim 32, wherein said metal is at least one of Ag and Au.

44. A method for fabricating a glass circuit substrate according to claim 32, wherein said Pd—P film comprises a pattern and said metal film also comprises a similar pattern thereto.

45. A method for fabricating a glass circuit substrate according to claim 44, comprising a step of connecting an electric element to said metal film.

* * * * *

UNITED STATES PATENT AND TRADEMARK OFFICE
CERTIFICATE OF CORRECTION

PATENT NO. : 6,156,413
DATED : December 5, 2000
INVENTOR(S) : Yoshiaki Tomari et al.

It is certified that error appears in the above-identified patent and that said Letters Patent is hereby corrected as shown below:

Column 1,
Line 40, "pm" should read -- µm --;
Line 46, "one" should read -- at one -- and "at" should be deleted.

Column 2,
Line 15, "$Pd^{2+}$," should read -- $Pd^{2+}$ --.

Column 12,
Line 11 to line 16, should read

-- Evaluation of adhesion   Average of measurement
                            results at 20 points good                        2.5 kg/2mm-by-2mm square or
                            higher mean                        1.0 to 2.5 kg/2mm-by-2mm square no good        .            1.0 kg/2mm-by-2mm square or
                            lower --; and Line 60, "follows. appa-" should read -- follows: ¶ appa --.

Column 13,
Line 36, "little containing" should read -- containing little --.

Signed and Sealed this

Eighteenth Day of December, 2001

Attest:

JAMES E. ROGAN
Attesting Officer    Director of the United States Patent and Trademark Office